US009991275B2

(12) United States Patent
Chang et al.

(10) Patent No.: US 9,991,275 B2
(45) Date of Patent: Jun. 5, 2018

(54) SEMICONDUCTOR MEMORY DEVICE

(71) Applicant: SAMSUNG ELECTRONICS CO., LTD., Suwon-si, Gyeonggi-do (KR)

(72) Inventors: Sung-Il Chang, Hwaseong-si (KR); Changseok Kang, Seongnam-si (KR); Byeong-In Choe, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/057,412

(22) Filed: Mar. 1, 2016

(65) Prior Publication Data

US 2016/0181274 A1  Jun. 23, 2016

Related U.S. Application Data

(63) Continuation of application No. 13/173,321, filed on Jun. 30, 2011.

(30) Foreign Application Priority Data

Jul. 1, 2010 (KR) .................. 10-2010-0063539

(51) Int. Cl.
*H01L 21/3205* (2006.01)
*H01L 21/4763* (2006.01)
(Continued)

(52) U.S. Cl.
CPC .... *H01L 27/11582* (2013.01); *H01L 27/1157* (2013.01); *H01L 29/4234* (2013.01); *H01L 29/792* (2013.01)

(58) Field of Classification Search
CPC . H01L 27/1157; H01L 27/11582; H01L 21/28
See application file for complete search history.

(56) References Cited

U.S. PATENT DOCUMENTS 7,679,133 B2   3/2010  Son et al.
7,956,408 B2   6/2011  Enda et al.
(Continued)

FOREIGN PATENT DOCUMENTS

JP   06-338602 A   12/1994
JP   2007-317874 A   12/2007
(Continued)

OTHER PUBLICATIONS

Jang, et al., Vertical Cell Array using TCAT (Terabit Cell Array Transistor) Technology for Ultra High Density NAND Flash Memory, 2009 Symposium on VLSI Technology Digest of Technical Papers, pp. 192-193; 978-4-86348-009-4 (VLSI)—2009.

(Continued)

*Primary Examiner* — Charles Garber
*Assistant Examiner* — Abdulfattah Mustapha
(74) *Attorney, Agent, or Firm* — Lee & Morse P.C.

(57) ABSTRACT

A method of manufacturing a semiconductor device includes forming a laminated structure including sacrificial layers and a select gate layer on a substrate, forming a penetration region penetrating the laminated structure, forming a select gate insulating layer on a sidewall of the select gate layer exposed by the penetration region, and forming an active pattern in the penetration region. The method also includes exposing a portion of the active pattern by removing the sacrificial layers and forming an information storage layer on the exposed portion of the active pattern.

22 Claims, 33 Drawing Sheets

(51) Int. Cl.
    *H01L 27/11582* (2017.01)
    *H01L 27/1157* (2017.01)
    *H01L 29/423* (2006.01)
    *H01L 29/792* (2006.01)

(56) References Cited

U.S. PATENT DOCUMENTS

| | | |
|---|---|---|
| 8,236,650 B2 | 8/2012 | Son et al. |
| 2006/0205160 A1 | 9/2006 | Lee |
| 2008/0197393 A1 | 8/2008 | Kim et al. |
| 2009/0121271 A1* | 5/2009 | Son .................. H01L 21/8221 257/315 |
| 2009/0310425 A1* | 12/2009 | Sim .................. H01L 27/11526 365/185.29 |
| 2010/0090286 A1 | 4/2010 | Lee et al. |
| 2010/0155810 A1* | 6/2010 | Kim .................. H01L 27/11548 257/316 |

FOREIGN PATENT DOCUMENTS

| | | |
|---|---|---|
| KR | 10-2008-0070583 A | 7/2008 |
| KR | 10-2009-0047614 A | 5/2009 |
| KR | 10-2009-0128776 A | 12/2009 |

OTHER PUBLICATIONS

Tanaka, et al,; Bit Cost Scalable Technology with Punch and Plug Process for Ultra High Density Flash Memory, 2007 Symposium on VLSI Technology Digest of Technical Papers, pp. 14-15, 978-4-900784-03-1 (VLSI)—2007.

* cited by examiner

SEMICONDUCTOR MEMORY DEVICE

CROSS-REFERENCE TO RELATED APPLICATION

This is a continuation application based on pending application Ser. No. 13/173,321, filed Jun. 30, 2011, the entire contents of which is hereby incorporated by reference.

This application claims priority under 35 U.S.C. § 119 of Korean Patent Application No. 10-2010-0063539, filed on Jul. 1, 2010, in the Korean Intellectual Property Office, and entitled: "Semiconductor Memory Device and Method of Forming the Same," which is incorporated by reference herein in its entirety.

BACKGROUND

As an electronics industry is being rapidly developed, an integration of semiconductor memory devices is increasing. The integration of semiconductor memory devices may be determined by an area that individual memory cells occupy. However, a miniaturization of patterns may have limits due to, e.g., equipment and/or difficulty of performing the manufacturing process.

SUMMARY

Embodiments may be realized by providing a method of manufacturing a semiconductor device. The method includes forming a laminated structure including sacrificial layers and a select gate layer on a substrate, forming a penetration region penetrating the laminated structure, forming a select gate insulating layer on a sidewall of the select gate layer exposed by the penetration region, forming an active pattern in the penetration region, exposing a portion of the active pattern by removing the sacrificial layers, and forming an information storage layer on the exposed portion of the active pattern.

The select gate insulating layer may be formed before the active pattern is formed, and the information storage layer may be formed after the active pattern is formed. Forming the select gate insulating layer may include performing a thermal oxidation process.

The select gate layer may be formed of polysilicon. Forming the select gate layer of the laminated structure may include forming a lower select gate layer between the sacrificial layers and the substrate, and forming an upper select gate layer on the sacrificial layers.

After forming the information storage layer, the method may include forming cell gate layers that fill spaces in the laminated structure formed by the removing of the sacrificial layers. Before forming the select gate insulating layer, the method may include recessing a sidewall of the select gate layer exposed by the penetration region.

The method may include forming a buffer insulating layer on the substrate before forming the laminated structure such that the buffer layer is between the substrate and the laminated structure. Forming the penetration region may include exposing the buffer insulating layer. The method may include exposing the substrate by removing the buffer insulating layer exposed by the penetration region after forming the select gate insulating layer. Forming the penetration region may include penetrating the buffer insulating layer to expose the substrate, and after forming the select gate insulating layer by a thermal oxidation process, the method may include removing a substrate thermal oxide layer formed on the exposed substrate.

Embodiments may also be realized by providing a method of manufacturing a three-dimensional semiconductor memory device. The method includes forming a laminated structure including sacrificial layers and a select gate layer such that the sacrificial layers and the select gate layer are stacked in a first direction, forming a penetration region penetrating the laminated structure such that the penetration region extends through the sacrificial layers and the select gate layer in the first direction, forming a select gate insulating layer on a sidewall of the select gate layer exposed by the penetration region, the sidewall of the select gate layer extending in the first direction, forming an active pattern in the penetration region such that the active pattern extends through the sacrificial layers and the select gate layer in the first direction, exposing a portion of the active pattern by removing the sacrificial layers, and forming an information storage layer on the exposed portion of the active pattern.

Removing the sacrificial layers may include forming a trench extending in the first direction through the laminated structure such that the sacrificial layers are exposed by the trench, and the trench is spaced apart from the penetration region, and the information storage layer may be formed in recesses exposed by the trench after removing the sacrificial layers.

Forming the information storage layer may include sequentially forming a tunnel insulating layer, a charge storage layer, and a blocking layer in the recesses after removing the sacrificial layers. After forming the information storage layer, the method may include forming a gate conductive layer in recesses remaining after forming the information storage layer. The gate conductive layer may be formed of a first material and the select gate may be formed of a second material, the first material being different from the second material. The information storage layer may be formed through the trench on sidewalls of the recesses, and a gate conductive layer may be formed through the trench to completely fill the recesses such that the information storage layer surrounds the gate conductive layer in the recesses.

Embodiments may also be realized by providing a semiconductor device that includes an active pattern extending vertically from a substrate, cell gates and a select gate on a sidewall of the active pattern, the cell gates including a first material and the select gate including a second material, the first material being different from the second material. The device includes information storage layers extending horizontally between the cell gates and the active pattern to cover top surfaces and bottom surfaces of the cell gates, and a select gate insulating layer between the select gate and the active pattern.

The first material of the cell gates may include at least one selected from metal, metal silicide, and conductive metal nitride, and the second material of the select gate may include polysilicon.

The select gate insulating layer may be between a sidewall of the select gate and the active pattern. The active pattern may include an extension portion protruding from a sidewall of the active pattern to the select gate. The semiconductor device may further include insulating layers between the cell gates and between the select gate and the cell gates, wherein the select gate is in direct contact with the insulating layer and the cell gates are separated from the insulating layer by the information storage layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
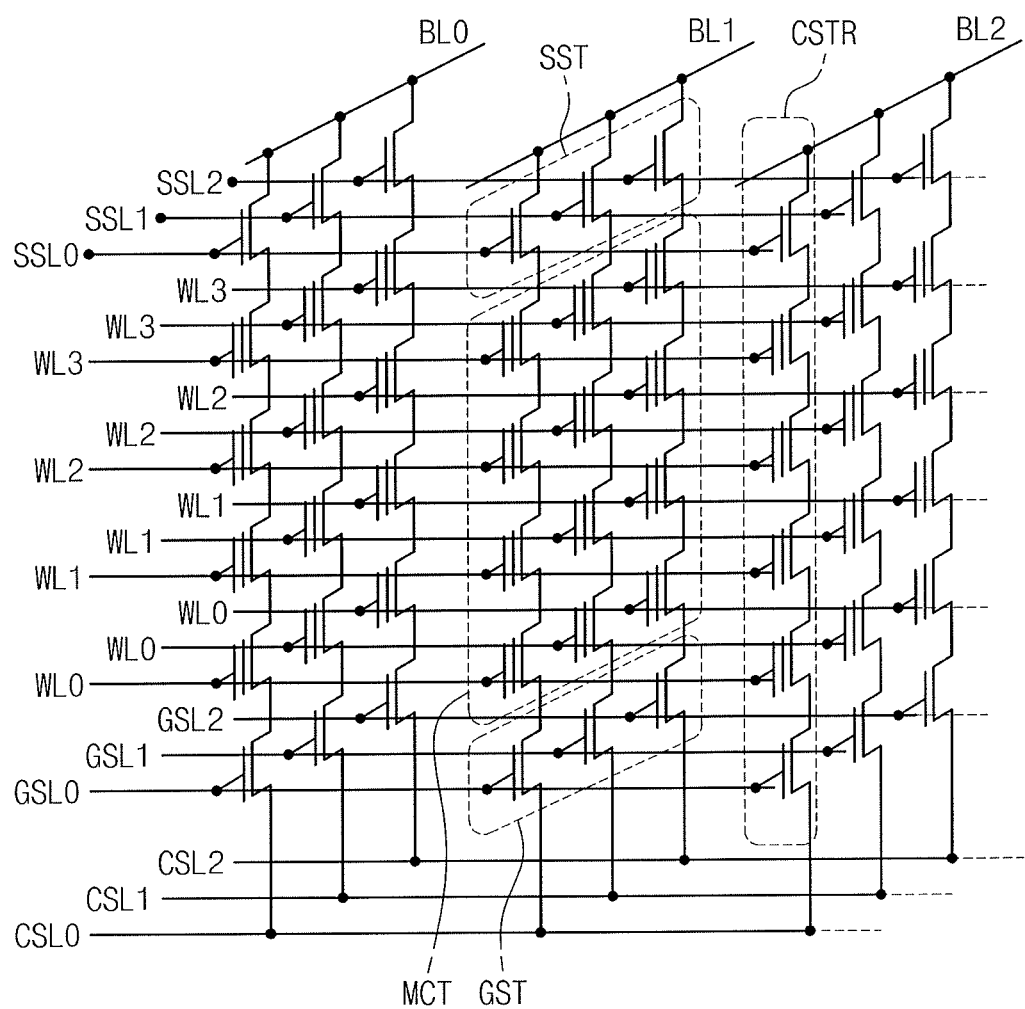
FIG. 1 illustrates a semiconductor device circuit, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. Like reference numerals refer to like elements throughout. It will also be understood that when an element such as a layer, region or substrate is referred to as being "on" or "onto" another element, it may lie directly on the other element or intervening elements or layers may also be present. It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure. As used herein, the term "and/or" includes any and all combinations of one or more of the associated listed items and may be abbreviated as "/".

FIG. 1 illustrates a semiconductor device circuit in accordance with exemplary embodiments.

Referring to FIG. 1, a three-dimensional semiconductor memory device, in accordance with an exemplary embodiment, may include a plurality of common source lines CSL0~CSL2, a plurality of bit lines BL0, BL1 and BL2, and a plurality of cell strings CSTR disposed between the common source lines CSL0~CSL2 and the bit lines BL0, BL1 and BL2. For example, the bit lines BL0, BL1 and BL2 may extend in a first plane in a first direction and the common source lines CSL0~CSL2 may extend in a second plane in a second direction. The plurality of cell strings CSTR may be disposed in an area between the first plane and the second plane. The first direction may be different from the second direction, e.g., the bit lines BL0, BL1 and BL2 may extend in a direction perpendicular to an extending direction of the common source lines CSL0~CSL2. Although only three common source lines and bit lines are illustrated in the drawing, this is for the brevity of description, and more common source lines, bit lines, and a corresponding number of cell strings CSTR may be arranged.

The bit lines BL0, BL1 and BL2 may be two dimensionally arranged. The plurality of cell strings CSTR may be connected to each of the bit lines BL0, BL1 and BL2 in parallel. For example, ones of the plurality of the cell strings CSTR may be connected to the bit line BL0, and others of the plurality of cell strings CSTR may be connected to one of the bit lines BL1 and BL2. The plurality of common source lines CSL0~CSL2 may be two dimensionally arranged. The cell strings CSTR may be connected to the common source lines CSL0~CSL2, e.g., in common. For example, ones of the plurality of cell strings CSTR may be connected to the common source line CSL0, and others of the cell strings CSTR may be connected to one of the common source lines CSL1 and CSL2. The plurality of cell strings CSTR may be disposed between one of the bit lines BL0, BL1, or BL2 and one of the common source lines CSL0, CSL1, or CLS2. A same electric voltage may be applied to the common source lines CSL0~CSL2. Each of the common source lines CSL0~CSL2 may be electrically controlled.

Each of the cell strings CSTR may be include a ground select transistor GST connected to one of the common source lines CSL0~CSL2, a string select transistor SST connected to one of the bit lines BL0~BL2, and a plurality of memory cell transistors MCT disposed between the ground select transistor GST and the string select transistor SST. The ground select transistor GST, the string select transistor SST, and the memory cell transistors MCT may be serially connected.

The common source lines CSL0~CSL2 may be connected to the ground select transistors GST, e.g., in common. A plurality of ground select lines GSL0~GSL2, a plurality of word lines WL0~WL3, and a plurality of string select lines SSL0~SSL2 that are disposed between the common source lines CSL0~CSL2 and the bit lines BL0~BL2 may be used as gate electrodes of the ground select transistors GST, the memory cell transistors MCT, and the string select transistor SST respectively. Each of the memory cell transistors MCT may include an information storage substance.

Each cell string CSTR may include a plurality of the memory cell transistors MCT. The memory cell transistors MCT may be spaced a different distance apart from the common source lines CSL0~CSL2, the word lines WL0~WL3, e.g., having a multilayer structure that are disposed between the common source line CSL0~CSL2, and the bit lines BL0~BL2.

Gate electrodes of memory cell transistors MCT may be arranged to be spaced a same distance apart from the common source line CSL0~CSL2. The gate electrodes of the memory cell transistors MCT may be connected to one of the word lines WL0~WL3 in common to be in, e.g., an equipotential state. Even though the gate electrodes of memory cell transistors MCT may be arranged to be spaced a same distance apart from the common source line CSL0~CSL2, the gate electrodes arranged in different columns and/or different rows may be controlled independently.

Figure 2:
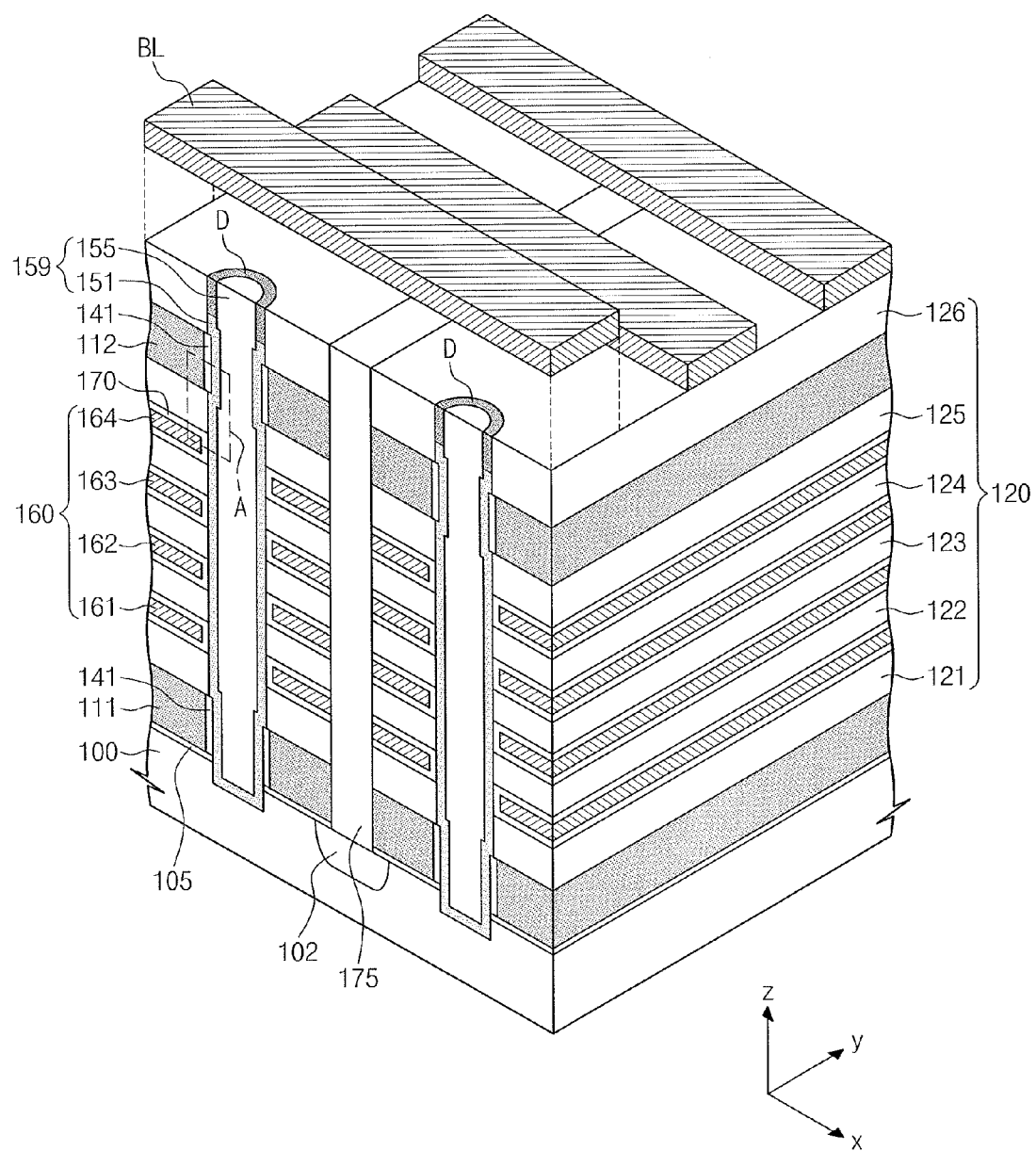
FIG. 2 illustrates a perspective view of a semiconductor device, according to an exemplary embodiment.
Figure 3:
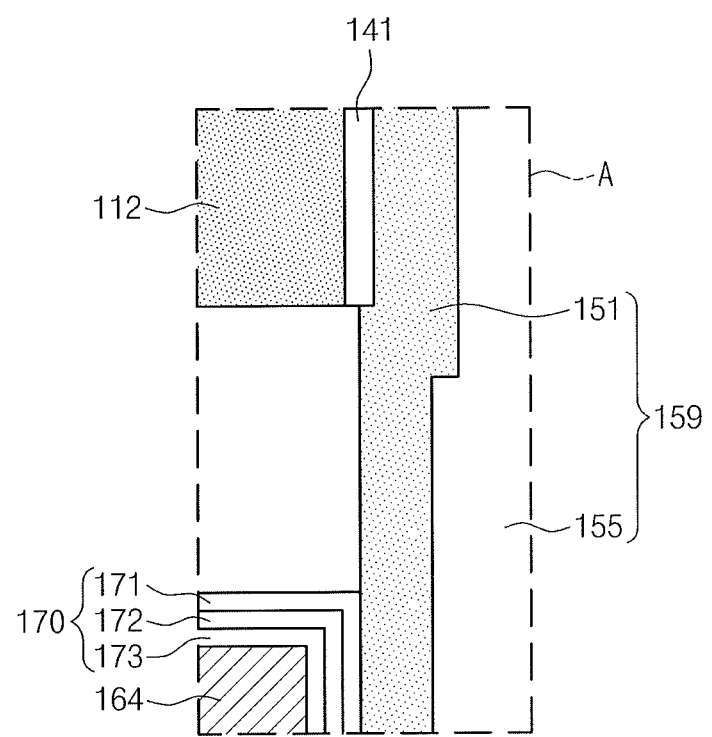
FIG. 3 illustrates an enlarged view of region "A" illustrated in FIG. 2.

Referring to FIGS. 2 and 3, a semiconductor device in accordance with a first exemplary embodiment will be described. FIG. 2 illustrates a perspective view of a semiconductor device in accordance with the first exemplary embodiment. FIG. 3 illustrates an enlarged view of "A" region in FIG. 2.

Referring to FIGS. 2 and 3, a substrate 100 may be provided. The substrate 100 may be, e.g., a silicon substrate, a germanium substrate, or a silicon-germanium substrate. The substrate 100 may be doped with a first type dopant. The first type dopant may be, e.g., a p-type dopant.

A plurality of gate layers may be provided on the substrate 100 and insulating layers 120 (121~126) may be provided into spaces spaced apart from one another between the plurality of gate layers. For example, the insulating layers 120 may be alternately arranged with the gate layers. The insulating layers 120 may be an oxide layer. The gate layers may include select gate layers and cell gate layers 160 (161~164). The select gate layers may include a lower select gate layer 111 provided under the cell gate layers 160 and an upper select gate layer 112 provided on the cell gate layers 160, e.g., the cell gate layers 160 may be disposed between the lower select gate layer 111 and the upper select gate layer 112. Each of the lower and upper select gate layers 111 and 112 may be thicker, e.g., occupy a great depth in the memory device, than each of the cell gate layers 160. The insulating layers 120 may contact, e.g., ones of the insulating layers 120 may be directly in contact with, top surfaces and/or bottom surfaces of one of the lower and upper select gate layers 111 and 112.

A buffer insulating layer 105 may be provided between the substrate 100 and the lower select gate layer 111. The buffer insulating layer 105 may be, e.g., a silicon oxide layer.

The gate layers and the insulating layers 120 may extend in a direction, e.g., along a y-axis direction, parallel to a top surface of the substrate 100. Although only four cell gate layers 160 are illustrated in the drawing, this is for the brevity of description and more cell gate layers may be arranged. Although one lower select gate layer 111 and one upper select gate layer 112 are illustrated in the FIG. 2, embodiments are not limited thereto, e.g., a plurality of upper and lower select gate layers may be provided.

The cell gate layers 160 and the lower and upper select gate layers 111 and 112 may be formed of different materials from one another. The cell gate layers 160 may include, e.g., at least one selected from metal, metal silicide, conductive metal nitride, and doped semiconductor material. The lower and upper select gate layers 111 and 112 may include, e.g., polysilicon. According to an exemplary embodiment, the lower and upper select gate layers 111 and 112 may be formed of only polysilicon. Further, the cell gate layers 160 may exclude polysilicon.

A plurality of active patterns 159 may be provided that extends upwardly, e.g., along a z-axis direction, from the substrate 100 and that penetrates the gate layers and the insulating layers 120. For example, one active pattern 159 may penetrate the lower select gate layer 111, the insulating layers 121-126, the cell gate layers 160, and the upper select gate layer 112. An area of cross section of the active pattern 159 at the place where the active pattern 159 and the lower and upper select gate layers 111 and 112 intersect may be smaller than an area of cross section of the active pattern 159 at the place where the active pattern 159 and the cell gate layers 160 intersect.

The active pattern 159 may be formed to have, e.g., a macaroni shape, and may include a channel pattern 151 and a buried layer 155 filling the inside of the channel pattern 151. However, embodiments are not limited thereto, e.g., the active pattern 159 may not include the buried layer 155. The active pattern 159 may include an internal wall portion and a bottom portion. A top surface of the bottom portion may be closer to the substrate 100 compared to a top surface of the lower select gate layer 111. The channel pattern 151 may be, e.g., a silicon layer. The channel pattern 151 may have an intrinsic state. The active pattern 159 may have various shapes, e.g., the active pattern 159 may be a circle, an oval, or a polygon from the viewpoint of plane. The active patterns 159 arranged in a first direction, e.g., the x-axis direction, constitute rows, and the active patterns 159 arranged in a second direction, e.g., the y-axis direction, constitute columns. According to an exemplary embodiment, throughout the present specification, the first, the second, and the third directions represent the x-axis, the y-axis, and the z-axis directions, respectively. A plurality of rows and a plurality of columns of the active patterns 159 may be arranged on the substrate 100.

An electrode separation pattern 175 may be disposed between a pair of columns adjacent to each other. For example, the electrode separation pattern 175 may extend in the second direction, e.g., the y-axis direction. The electrode separation pattern 175 may include an insulating material. For example, the electrode separation pattern 175 may be, e.g., a high density plasma oxide layer, a spin on glass (SOG) layer, and/or a chemical vapor deposition (CVD) oxide layer.

A common source region 102 may be provided in the substrate 100 under a bottom surface of the electrode separation pattern 175. The common source region 102 may have a line shape extending in the second direction, e.g., the y-axis direction. The common source region 102 may be a region doped with a second type dopant. The second type dopant may be different from the first type dopant of the substrate 100.

A select gate insulating layer 141 may be provided between each of the lower and upper select gate layers 111 and 112 and the active pattern 159. The select gate insulating layer 141 may be, e.g., a thermal oxide layer formed through a thermal oxidation process. As an example, in the case that the lower and upper select gate layers 111 and 112 are polysilicon, the select gate insulating layer 141 may be a silicon oxide layer obtained by thermally oxidizing the lower and upper select gate layers 111 and 112. The select gate insulating layers 141 may contact, e.g., be directly attached to, the lower and upper select gate layers 111 and 112 and the active pattern 159. The select gate layers 141 may be locally disposed between the lower and upper select gate layers 111 and 112 and sidewalls of the active pattern 159.

A plurality of information storage layers 170 may be provided between the cell gate layers 160 and the active pattern 159. The information storage layer 170 may be in direct contact with the cell gate layer 160 and the channel pattern 151 of the active pattern 159. At least a portion of the information storage layers 170 may extend in an area between, e.g., directly between, the cell gate layers and the active pattern 159. At least a portion of the information storage layers 170 may horizontally extend from the place between the cell gate layers 160 and the active pattern 159 to cover top surfaces and bottom surfaces of the cell gate layers 160. That is, the cell gate layers 160 may be spaced apart from the insulating layers 120 and/or the active pattern 159 by the information storage layer 170.

Referring to FIG. 3, the information storage layer 170 may have a multi-thin layer structure. The multi-thin layer structure of the information storage layer 170 may include a material having a band gap smaller than a band gap of a silicon oxide layer. As an example, the information storage layer 170 may include a charge storage layer 172 capable of storing a charge. The information storage layer 170 may include a tunnel insulating layer 171 between the charge storage layer 172 and the active pattern 159. The information storage layer 170 may include a blocking layer 173 between the charge storage layer 172 and the cell gate layers 160. According to an exemplary embodiment, the blocking layer 173, the charge storage layer 172, and the tunnel insulating layer 171 may be sequentially stacked on each other. Each of the blocking layer 173, the charge storage layer 172, and the tunnel insulating layer 171 may include horizontal portions extending on upper and lower surfaces of the cell gate layers 160 and a vertical portion extending between the cell gate layers and the channel pattern 151. The blocking layer 173, the charge storage layer 172, and the tunnel insulating layer 171 may substantially overlap each other and may surround three sides of the cell gate layer 160.

The charge storage layer 172 may include a material having a band gap smaller than the tunnel insulating layer 171 and the blocking layer 173. The charge storage layer 172 may be formed of material having traps for storing charges. As an example, the charge storage layer 172 may include at least one of a silicon nitride layer, a metal nitride layer, a metal oxynitride layer, a metal silicon oxide layer, a metal silicon oxynitride layer, and nano dots. The blocking layer 173 may include at least one selected from a silicon oxide layer, a silicon nitride layer, a silicon oxynitride layer, and a high dielectric layer. The high dielectric layer may include at least one of a metal oxide layer, a metal nitride layer, and a metal oxynitride layer. The high dielectric layer may include at least one of hafnium (Hf), zirconium (Zr), aluminum (Al), tantalum (Ta), lanthanum (La), cerium (Ce), and praseodymium (Pr). A dielectric constant of the blocking layer 173 may be larger than that of the tunnel insulating layer 171. Unlike the select gate insulating layer 141, the tunnel insulating layer 171 may not be a thermal oxide layer.

A drain region D may be provided in the channel pattern 151, e.g., adjacent to the uppermost insulating layer 126 on the upper select gate layer 112. Bit lines BL, which may include bit lines BL0, BL1 and BL2, may be provided that extend in a direction, e.g., the x-axis direction, intersecting the gate layers and that are electrically connected to the drain region D. The bit lines BL may include a conductive material.

Referring to FIGS. 4 through 12, a method of manufacturing a semiconductor device in accordance with the an exemplary embodiment is described.

Figure 4:
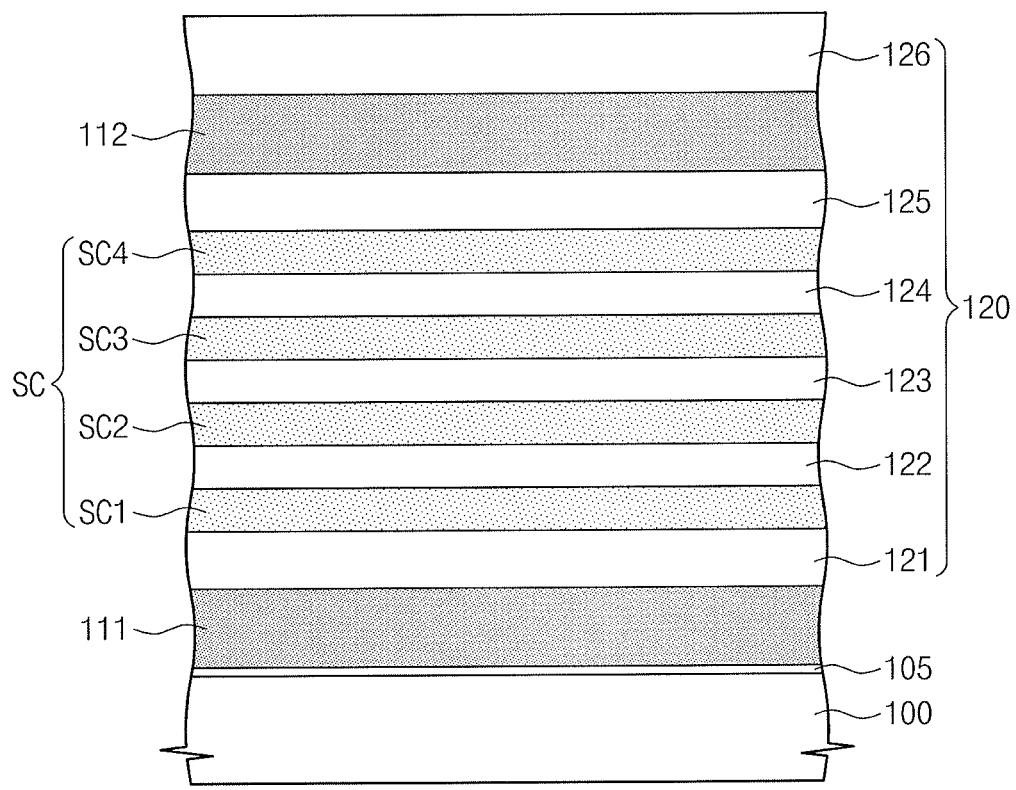
FIGS. 4 through 12 illustrate cross-sectional views of stages in a method of manufacturing the semiconductor device, according to an exemplary embodiment.

Referring to FIG. 4, a substrate 100 is provided. The substrate 100 may be a semiconductor substrate. For example, the substrate 100 may be a silicon substrate, a germanium substrate, a silicon-germanium substrate, or a compound semiconductor substrate. The substrate 100 may be doped with the first type dopant.

A laminated structure including sacrificial layers SC (SC1~SC4) and the lower and upper select gate layers 111 and 112 may be formed on the substrate 100. Forming the laminated structure may further include forming some of the insulating layers 120 between the sacrificial layers SC, e.g., forming some of the insulating layers 120 and the sacrificial layers SC in an alternating arrangement. The laminated structure may be formed between the lower select gate layer 111 and the upper select gate layer 112. One insulating layer 120, e.g., insulating layer 126, may be formed on the upper select gate layer 112. The lower and upper select gate layers 111 and 112 may be formed from polysilicon. The sacrificial layers SC may be formed of a material having an etching selectivity with respect to the lower and upper select gate layers 111 and 112 and the insulating layers 120. As an example, the insulating layers 120 may be formed from an oxide and the sacrificial layers SC may be formed from nitride and/or oxynitride. All of the sacrificial layers SC may be formed of a same material.

A thickness of the lower and upper select gate layers 111 and 112 may be formed to be greater than a thickness, e.g., width along the z-axis direction, of the sacrificial layers SC. The insulating layers 121, 125, and 126 that are in contact with one of the lower and upper select gate layers 111 and 112 may be formed to be thicker, e.g., along the z-axis direction, than the insulating layers 122, 123 and 124 between the sacrificial layers SC. The lower and upper select gate layers 111 and 112, the sacrificial layers SC, and the insulating layers 120 may be formed using a chemical vapor deposition (CVD) or an atomic layer deposition (ALD).

Before forming the laminated structure, a buffer insulating layer 105 may be formed on the substrate 100. The lower select gate layer 111 may be formed on, e.g., directly on, the buffer insulating layer 105. The buffer insulating layer 105 may be formed from a dielectric substance having an etching selectivity with respect to the sacrificial layers SC. For example, the buffer insulating layer 105 may be formed from an oxide, e.g., a thermal oxide.

Figure 5:
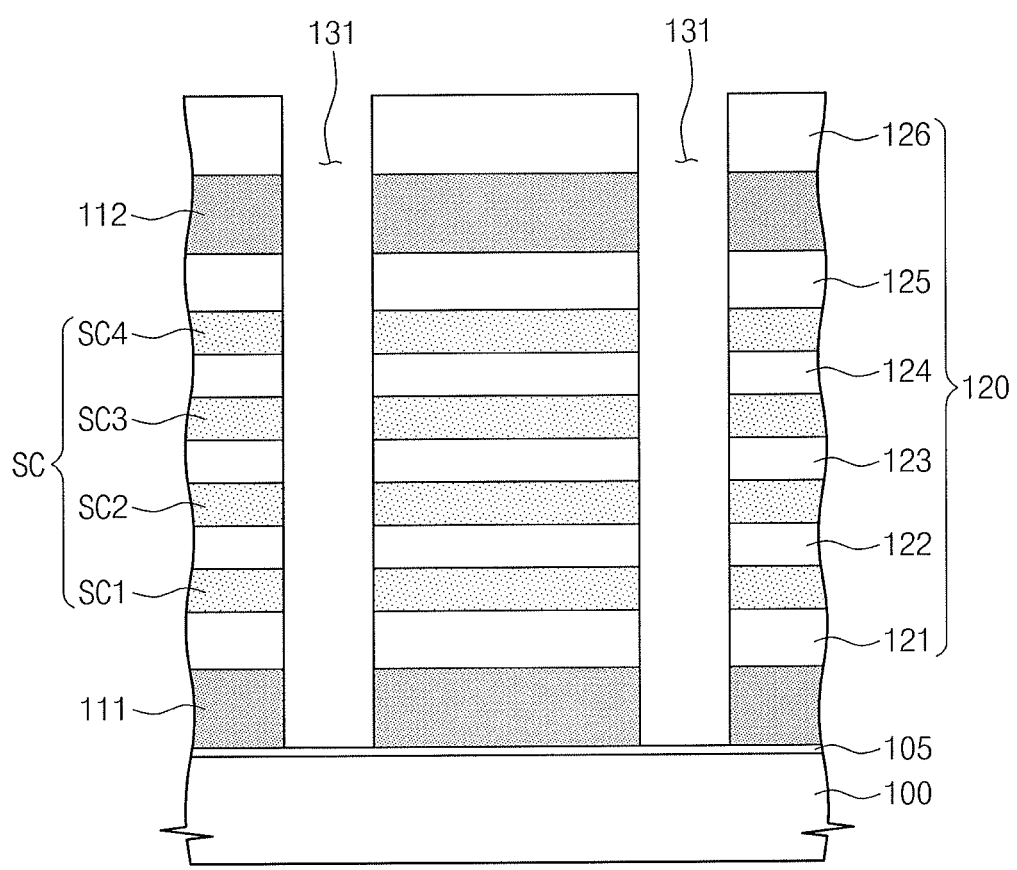

Referring to FIG. 5, the lower and upper select gate layers 111 and 112, the insulating layers 120, and the sacrificial layers SC of the laminated structure may be successively patterned to form a penetration region 131 exposing the buffer insulating layer 105 and/or the substrate 100. The penetration region 131 may be formed using, e.g., an anisotropic etching process. When forming the penetration region 131, a portion of the buffer insulating layer 105 may be etched. The penetration region 131 may have a hole shape and/or may have a columnar shape. The penetration region 131 may be two dimensionally arranged along a first direction, e.g., the x-axis direction, and a second direction, e.g., the y-axis direction, which is perpendicular to the first direction. The first and second directions may be parallel to a top surface of the substrate 100. The penetration region 131 may be parallel to the electrode separation pattern 175. The penetration region 131 may have a circle shape, an oval shape, or a polygonal shape from the viewpoint of plane. For example, the penetration region 131 may have a substantially cylindrical shape or a substantially rectangular prism shape.

Figure 6:
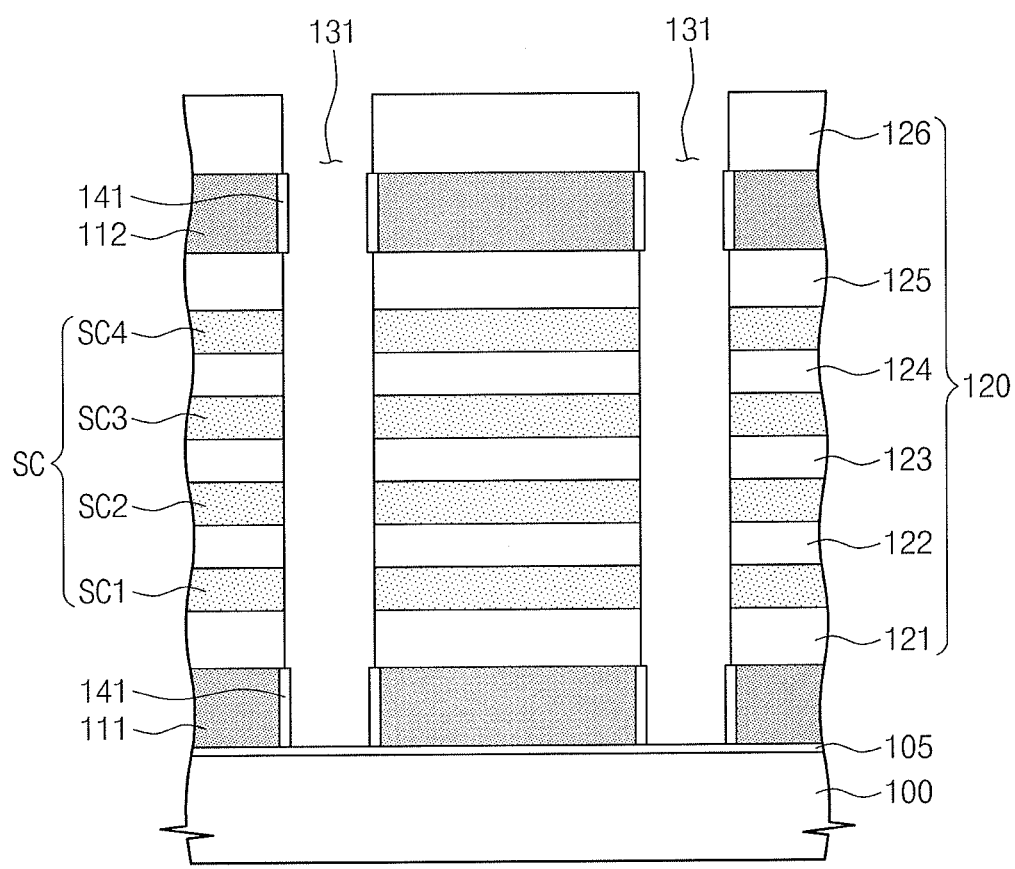

Referring to FIG. 6, a select gate insulating layer 141 may be formed on sidewalls of the lower and upper select gate layers 111 and 112 exposed by the penetration region 131. The select gate insulating layer 141 may be formed by a thermal oxidation process, e.g., a thermal oxidation process on lateral sides of the lower and upper select gate layers 111 and 112 exposed by the penetration region.

Figure 7:
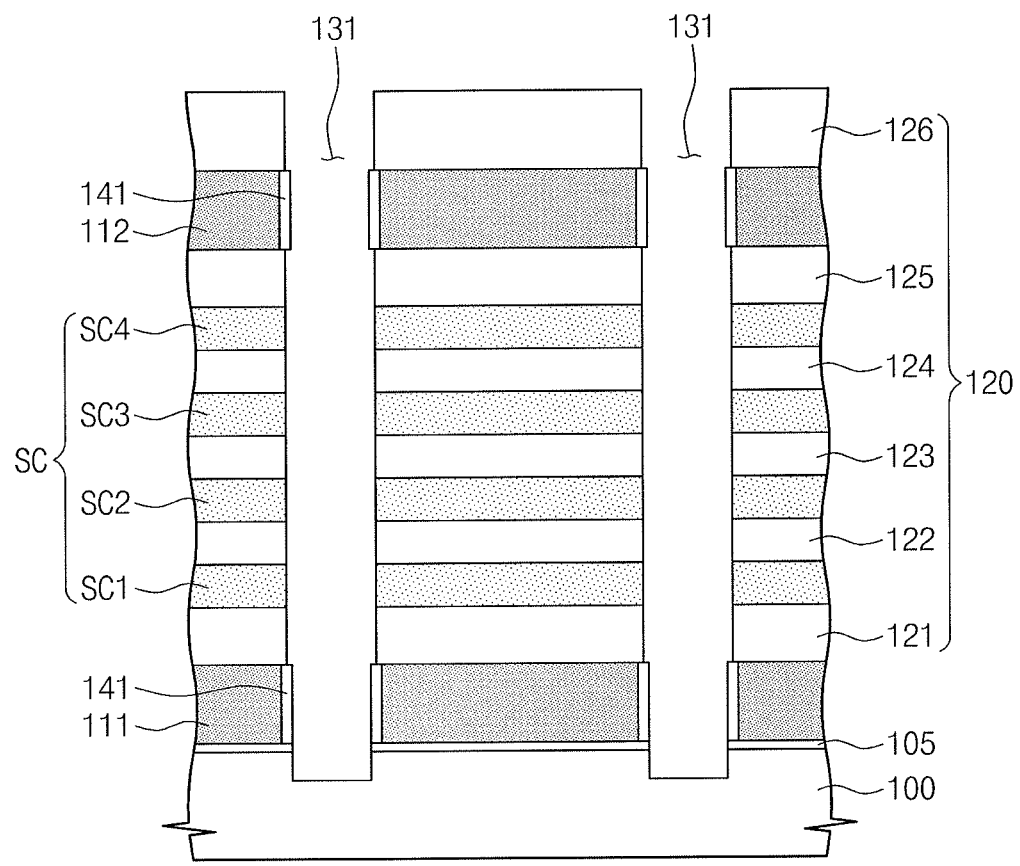

Referring to FIG. 7, the substrate 100 may be exposed by removing the buffer insulating layer 105 exposed by the penetration region 131, if the buffer insulating layer 105 was not removed or substantially removed during the forming of the penetration region 131. When removing the buffer insulating layer 105, a portion of the substrate 100 may be recessed. As an example, a removal of the buffer insulating layer 105 may be performed by a dry etching using plasma having a strong directivity.

Figure 8:
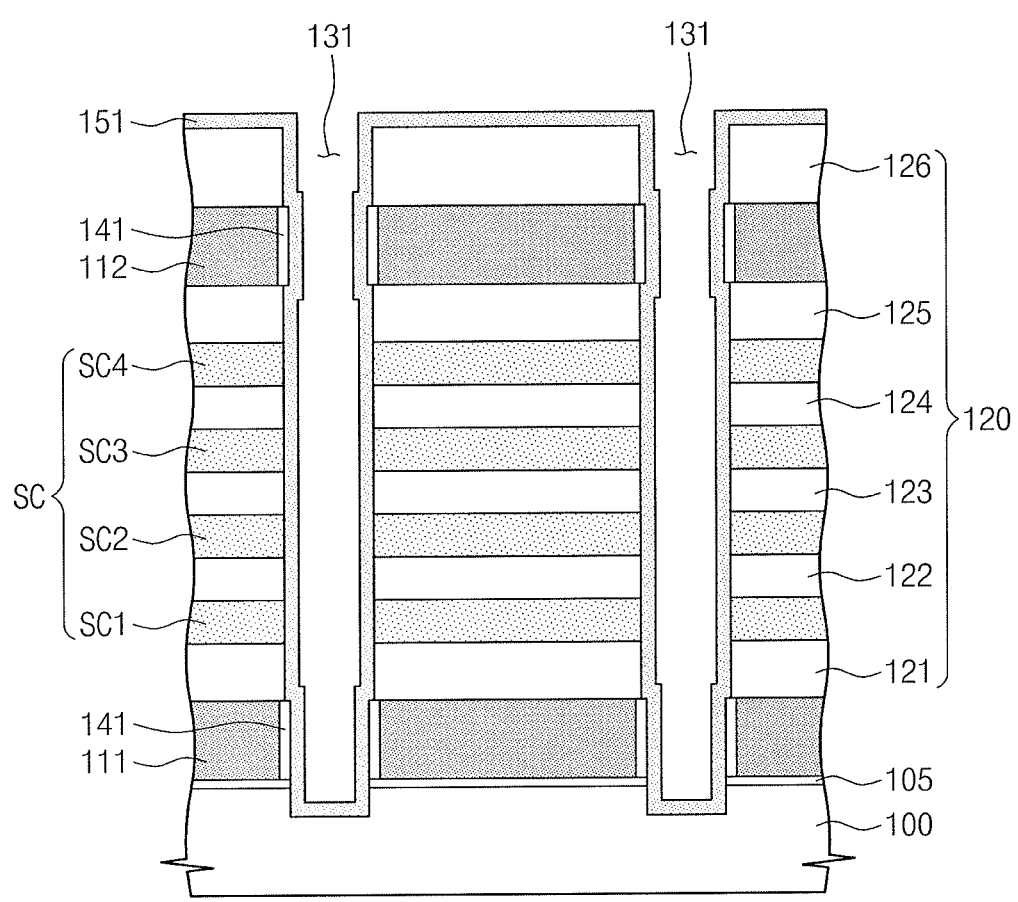

Referring to FIG. 8, a channel pattern 151 may be formed along a sidewall and a bottom of the penetration region 131. The channel pattern 151 may also be formed on the uppermost surface of the laminated structure, e.g., an upper surface of the insulating layer 126. The channel pattern 151 may be formed from, e.g., silicon. The channel pattern 151 may have an uneven surface, e.g., due to the select gate insulating layer 141 formed on the lower and upper select gate layers 111 and 112. That is, a portion of the channel pattern 151 provided onto a sidewall of the lower select gate layers 111 and 112 may protrude inwardly, e.g., in a direction toward a center of the penetration region 131, compared with a portion of the channel pattern 151 provided onto sidewalls of the sacrificial layers SC. A portion of the channel pattern 151 provided in the substrate, i.e., the recessed portion of the substrate 100 in the penetration region 131, may protrude inwardly similar to the portion of the channel pattern 151 provided onto a sidewall of the lower select gate layer 111.

Figure 9:
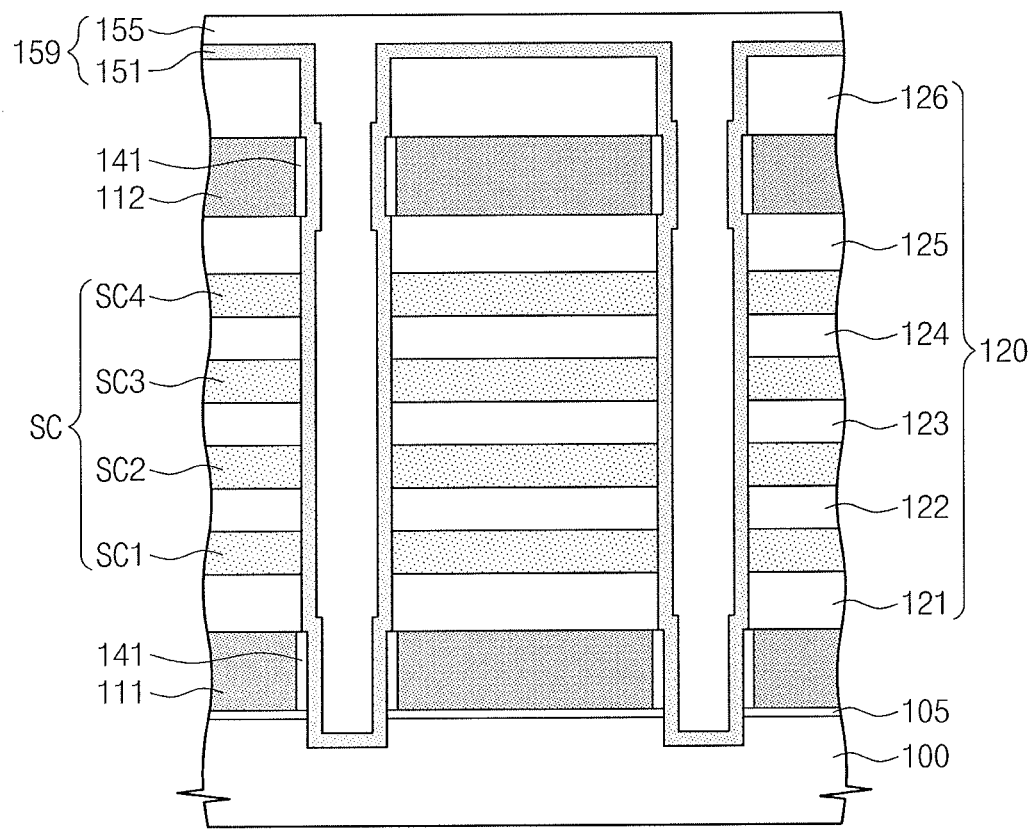

Referring to FIG. 9, a buried layer 155 filling, e.g., completely filling and/or substantially completely filling, the penetration region 131 may be formed on the channel pattern 151. The buried layer 155 may also be formed on portions of the channel pattern 151 on the uppermost surface of the laminated structure. The buried layer 155 may be, e.g., a nitride layer or an oxynitride layer. The channel pattern 151 and the buried layer 155 may together constitute the active pattern 159. The channel pattern 151 and the buried layer 155 may be formed using a chemical vapor deposition (CVD) and/or an atomic layer deposition (ALD).

Figure 10:
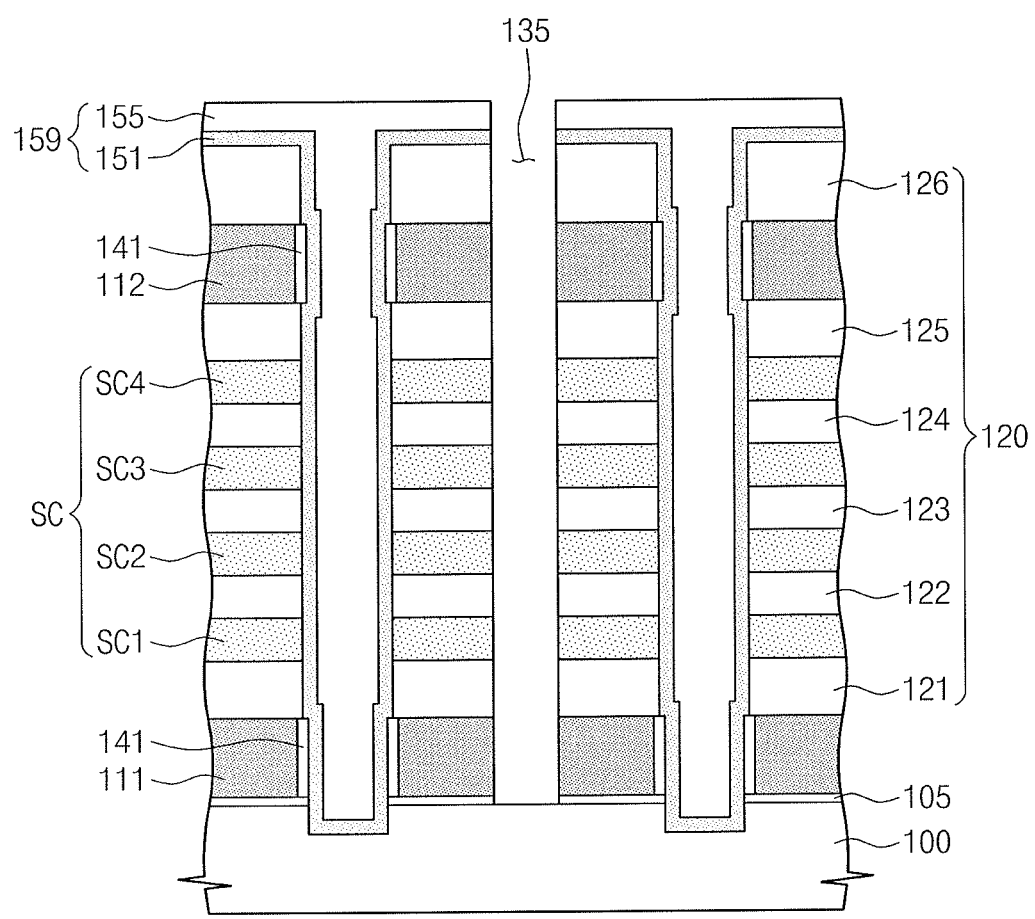

Referring to FIG. 10, the channel pattern 151, the buried layer 155, the lower and upper select gate layers 111 and 112, the insulating layers 120, and the sacrificial layers SC are successively patterned to form a trench 135. For example, the portions of the channel pattern 151 and the buried layer 155 on the uppermost surface of the laminated structure may be patterned to form the trench 135. Forming the trench 135 may be performed by, e.g., an anisotropic etching process. The trench 135 may extend, e.g., may be elongated, in the second direction, e.g., in the y-axis direction. As a result, the upper and lower select gate layers 111 and 112, the insulating layers 120, and the sacrificial layers SC may have a line shape extending in the second direction, e.g., in the y-axis direction. According to an exemplary embodiment, a bottom of the trench 135 may be exposed to the substrate 100, i.e., the substrate 100 may be exposed by the trench 135. When forming the trench 135, a portion of the substrate 100 may be patterned together. According to another exemplary embodiment, a bottom of the trench 135 may be exposed to the buffer insulating layer 105, i.e., the buffer insulating layer 105 may be exposed by the trench 135. For convenience of description, the exemplary embodiment that a bottom of the trench 135 is exposed to the substrate 100 will be described. However, embodiments are not limited thereto.

Figure 11:
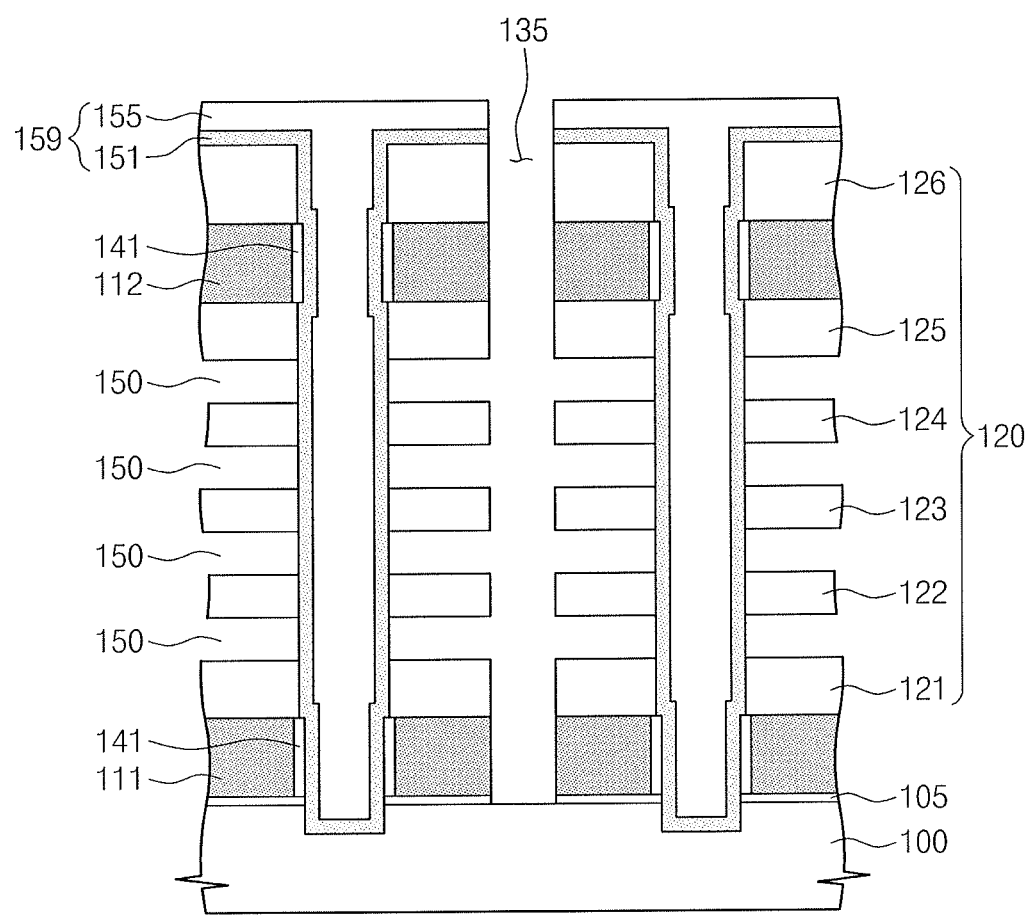

Referring to FIG. 11, the sacrificial layers SC exposed by the trench 135 may be removed by, e.g., a selective etching process, to form recess regions 150. The sacrificial layers SC may be removed through the trench 135. The selective etching process may be an isotropic etching process. The selective etching process may be, e.g., a wet etching process and/or a dry isotropic etching process. An etching rate of the sacrificial layers SC by the selective etching process may be greater than etching rates of the insulating layers 120, the lower and upper select gate layers 111 and 112, and the channel pattern 151. Therefore, after performing the selective etching process, the insulating layers 120, the lower and upper select gate layers 111 and 112, and the channel pattern 151 may remain. The recess regions 150 may expose portions of a sidewall of an adjacent channel pattern 151, i.e., the channel pattern 151 formed in an adjacent penetration region 131.

Figure 12:
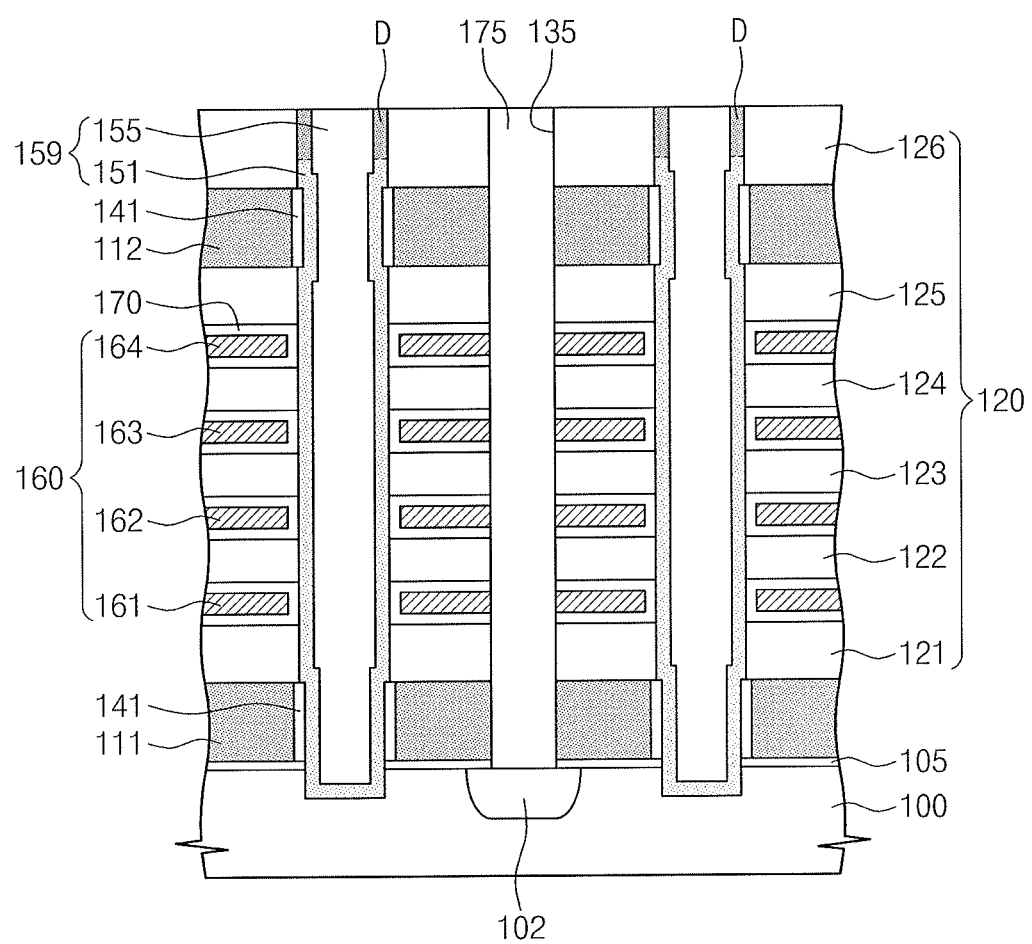

Referring to FIGS. 2, 3, and 12, after the recess regions 150 are formed, an information storage layer 170 may be formed on the substrate 100. The information storage layer 170 may be formed using a deposition process, e.g., CVD or ALD, which may provide superior step coverage. Thus, the information storage layer 170 may be formed substantially conformally, e.g., substantially uniformly. The information storage layer 170 may be formed through the trench 135. The information storage layer 170 may be formed to have a uniform thickness along the inner sides of the recess regions 150. The information storage layer 170 may fill a portion of the recess regions 150. As described in FIG. 3, forming the information storage layer 170 may include sequentially forming a tunnel insulating layer 171, a charge storage layer 172, and a blocking layer 173. The information storage layer 170 may be formed after the active pattern 159 is formed while the select gate insulating layer 141 may be formed before the active pattern 159 is formed.

The tunnel insulating layer 171 may be formed to cover a portion of the sidewall of the channel pattern 151, e.g., to be directly on exposed portions of the sidewall of the channel pattern 151. The tunnel insulating layer 171 may be a single layer or a multilayer. For example, the tunnel insulating layer 171 may include at least one selected from a silicon oxide layer, a silicon nitride layer, a silicon oxynitride layer, and a metal oxide layer.

The charge storage layer 172 may be spaced apart from the active pattern 159 by the tunnel insulating layer 171. The charge storage layer 172 may be on, e.g., directly on, the tunnel insulating layer 171. The charge storage layer 172 may cover the entire tunnel insulating layer 171 or may cover portions of the tunnel insulating layer 171. The charge storage layer 172 may include charge trap sites that are capable of storing charges. For example, the charge storage layer 172 may include at least one of a silicon nitride layer, a metal nitride layer, a metal oxynitride layer, a metal silicon oxide layer, a metal silicon oxynitride layer, and nano dots.

The blocking layer 173 may cover the charge storage layer 172. The blocking layer 173 may be on, e.g., directly on, the charge storage layer 172. The blocking layer 173 may include at least one selected from a silicon oxide layer, a silicon nitride layer, a silicon oxynitride layer, and a high dielectric layer. The high dielectric layer may include at least one selected from a metal oxide layer, a metal nitride layer, and a metal oxynitride layer. The high dielectric layer may include at least one of hafnium (Hf), zirconium (Zr), aluminum (Al), tantalum (Ta), lanthanum (La), cerium (Ce), and praseodymium (Pr). A dielectric constant of the blocking layer 173 may be larger than that of the tunnel insulating layer 171.

Cell gate layers 160 (161~164) may be formed to fill, e.g., completely fill and/or substantially completely fill, the recess regions 150, which have the information storage layer 170 formed therein. According to an exemplary embodiment, after forming the information storage layer 170, a gate conductive layer (not shown) may be formed on the substrate 100. The gate conductive layer may fill the recess regions 150, e.g., completely fill the remaining portions of the recess regions 150. The gate conductive layer may be formed using, e.g., a chemical vapor deposition (CVD) process, a physical vapor deposition (PVD) process, or an atomic layer deposition (ALD) process. The gate conductive layer may include at least one selected from metal, metal silicide, conductive metal nitride, and doped semiconductor material. According to an exemplary embodiment, the gate conductive layer and the resulting cell gates may exclude polysilicon.

After forming the gate conductive layer, a planarization process may be performed to expose the uppermost insulating layer 126, e.g., to remove portions of the gate conductive layer on the uppermost insulating layer 126. The gate conductive layer disposed outside the recess regions 150 may be removed to form cell gate layers 160 in the recess regions 150, after forming the gate conductive layer. For example, forming the cell gate layers 160 may include removing the gate conductive layers in the trench 135 to leave the gate conductive layer in the recess regions 150. When forming the cell gate layers 160, a portion of the information storage layer 170 formed outside the recess regions 150 may be removed together with the portions of the gate conductive layer outside the recess regions 150. Removal of a portion of the gate conductive layer and removal of a portion of the information storage layer 170 may be performed by a wet etching process and/or a dry etching process. The cell gate layers 161~164 may be disposed on different layers vertically from a top surface of the substrate 100, e.g., may be sequentially stacked along the vertical direction in the z-axis direction. The cell gate layers 161~64 may be separated, e.g., spaced apart, from one another by the etching process.

A common source region 102 may be formed in, e.g., within, the substrate 100 under a bottom surface of the trench 135. The common source region 102 may have a line shape extending in the second direction, e.g., along the y-axis direction. The common source region 102 may be a region doped with a second type dopant. The substrate 100 may be doped with the first type dopant, and the common source region 102 may be doped with the second type dopant. The common source region 102 may be formed by implanting the second type dopant ions into the substrate 100. During the forming of the common source region 102, the uppermost insulating layer 126 may be used as an ion implantation mask.

A drain region D may be formed at an upper portion of the channel pattern 151. The drain region D may be doped with the second type dopant. The drain region D may be formed by doping the channel pattern 151 with the second type dopant. A bottom surface of the drain region D may be higher than a top surface of the upper select gate layer 112. Alternatively, a bottom surface of the drain region D may have a height similar to, e.g., substantially the same as, a top surface of the upper select gate layer 112. The drain region D may be formed in the channel pattern 151 in concurrence with, e.g., at the same time as, the common source region 102 is formed in the substrate 100. Alternatively, the drain region D may be formed before or after forming the common source region 102, i.e., the drain region D may be formed separately from the forming of the common source region 102.

An electrode separation pattern 175 may be formed to fill, e.g., completely fill and/or substantially completely fill, the trench 135. Forming the electrode separation pattern 175 may include, e.g., firstly forming an dielectric layer filling the trench 135 and secondly performing a planarization process down to a top surface of the uppermost insulating layer 126, e.g., to expose the uppermost insulating layer 126. The electrode separation pattern 175 may include an insulating material. For instance, the electrode separation pattern 175 may be formed from a high density plasma oxide layer, a spin on glass (SOG) layer, and/or a CVD oxide layer.

After forming the electrode separation pattern 175, bit lines BL electrically connected to the drain region D may be formed, as illustrated in FIG. 2. The bit lines BL may extend in the first direction, e.g., in direction parallel to the x-axis direction. The bit lines BL may extend in a direction perpendicular to the extending direction of the electrode separation pattern 175 and the extending direction of the cell gate layers 160. Each bit line BL may be connected to a plurality of active patterns 159, and the cell gate layers 160 connected thereto, which are disposed along the first direction. Each bit line BL may correspond to only a plurality of active patterns 159 disposed along the first direction such that a plurality of bit lines BL are formed along the y-direction to correspond to other active patterns 159. The bit lines BL may be formed on, e.g., directly on, the uppermost insulating layer 126 and the electrode separation pattern 175. Alternatively, an interlayer dielectric layer covering the uppermost insulating layer 126 and the electrode separation pattern 175 may be formed, and then the bit lines BL may be formed on interlayer dielectric layer. In this case, the bit lines BL may be electrically connected to the drain region D through a contact plug penetrating the interlayer dielectric layer.

According to embodiments, e.g., the exemplary embodiment discussed above, the insulating layers of a select gate and a cell gate may be formed from a different material. For example, a tunnel insulating layer of the select gate may not include a charge storage layer. Therefore, the possibility of and/or it may be prevented that a threshold voltage of a select transistor becomes unstable due to a hot carrier. Also, the select gate and the cell gate may be formed from a different material. For example, the select gate may be formed of polysilicon and the cell gates may be formed of formed of a material that includes at least one selected from metal, metal silicide, conductive metal nitride, and doped semiconductor material.

A gate length of the select gate may be more easily controlled compared with the case that the select gate and the cell gate are formed at the same time. For example, in the case that the select gate is formed through a gate replacement, when a gate thickness of the select gate increases, the conductive layer may be conformally formed along the recess region without filling the recess region. According to embodiments, the above with respect to the gate length of the select gate may be addressed.

In FIGS. 2 through 12, an exemplary embodiment it which the lower and upper select gate layers 111 and 112 are formed before the cell gate layers 160 are formed was described, but embodiments are not limited thereto. For example, either the lower select gate layer 111 or the upper select gate layer 112 may be formed by the same method as the cell gate layers 160.

Referring to FIGS. 13 through 16, a method of manufacturing a semiconductor device in accordance with a modified embodiment of the first exemplary embodiment is described. Some structures and methods of the present embodiment are similar to those of the first exemplary embodiment. Thus, for brevity of description, the description of common features may be omitted below.

Figure 13:
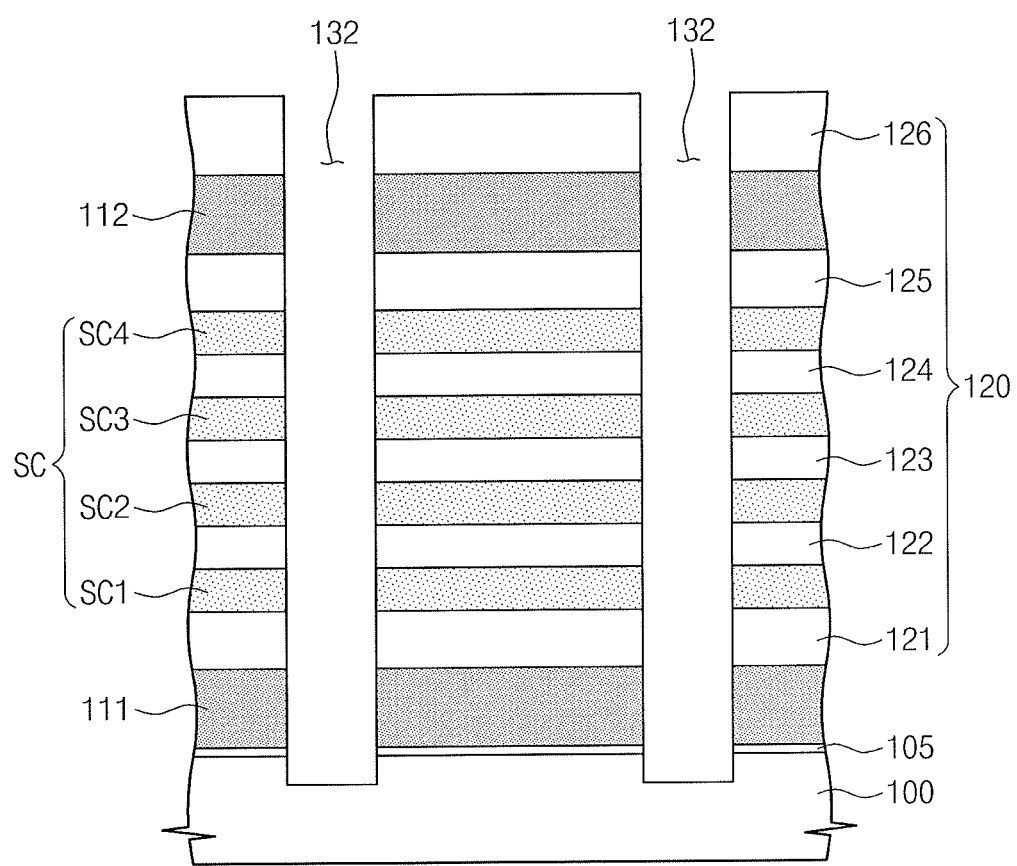
FIGS. 13 through 16 illustrate cross-sectional views of stages in a method of manufacturing the semiconductor device, according to an exemplary embodiment.

Referring to FIG. 13, the lower and upper select gate layers 111 and 112, the sacrificial layers SC, the insulating layers 120, and the buffer insulating layer 105 of FIG. 4, may be successively patterned to form a penetration region 132 exposing the substrate 100. The penetration region 132 may be formed using, e.g., an anisotropic etching process. When forming the penetration region 132, a portion of the substrate 100 may be etched. For example, a trench may be formed in the substrate 100 that corresponds to the penetration region 132.

Figure 14:
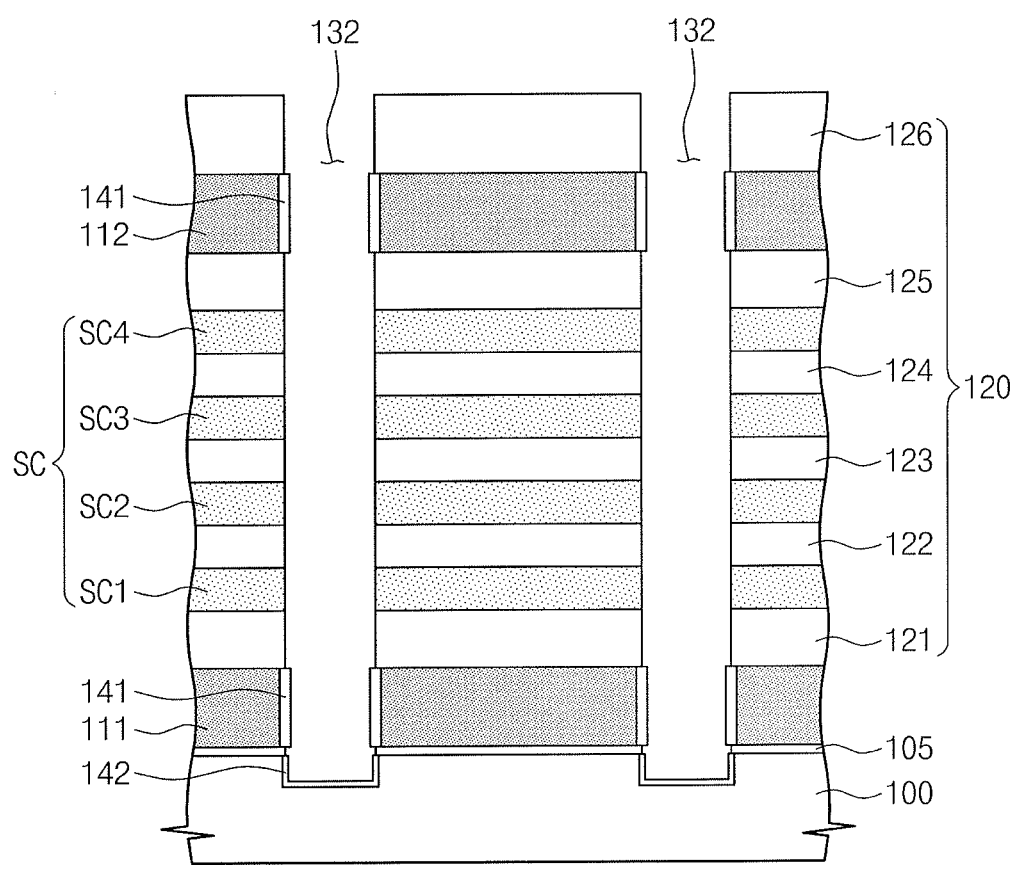

Referring to FIG. 14, a select gate insulating layer 141 may be formed on sidewalls of the lower and upper select gate layers 111 and 112, which may be exposed by the penetration region 132. The select gate insulating layer 141 may be formed by, e.g., a thermal oxidation process. When performing the thermal oxidation process, a substrate thermal oxide layer 142 may also be formed, e.g., may be formed at the same times as the forming of the select gate insulating layer 141. The substrate thermal oxide layer 142 may be formed on a bottom surface and sidewalls of the portion of the substrate 100 that were etched when forming the penetration region 132. The substrate thermal oxide layer 142 may be thinner than the select gate insulating layer 141. That is, in the case that the lower and upper select gate layers 111 and 112 are polysilicon and the substrate 100 is single crystalline silicon, an oxide layer by a thermal oxidation process may be more thickly formed on the lower and upper select gate layers 111 and 112 of polysilicon than the substrate 100 of single crystalline silicon.

Figure 15:
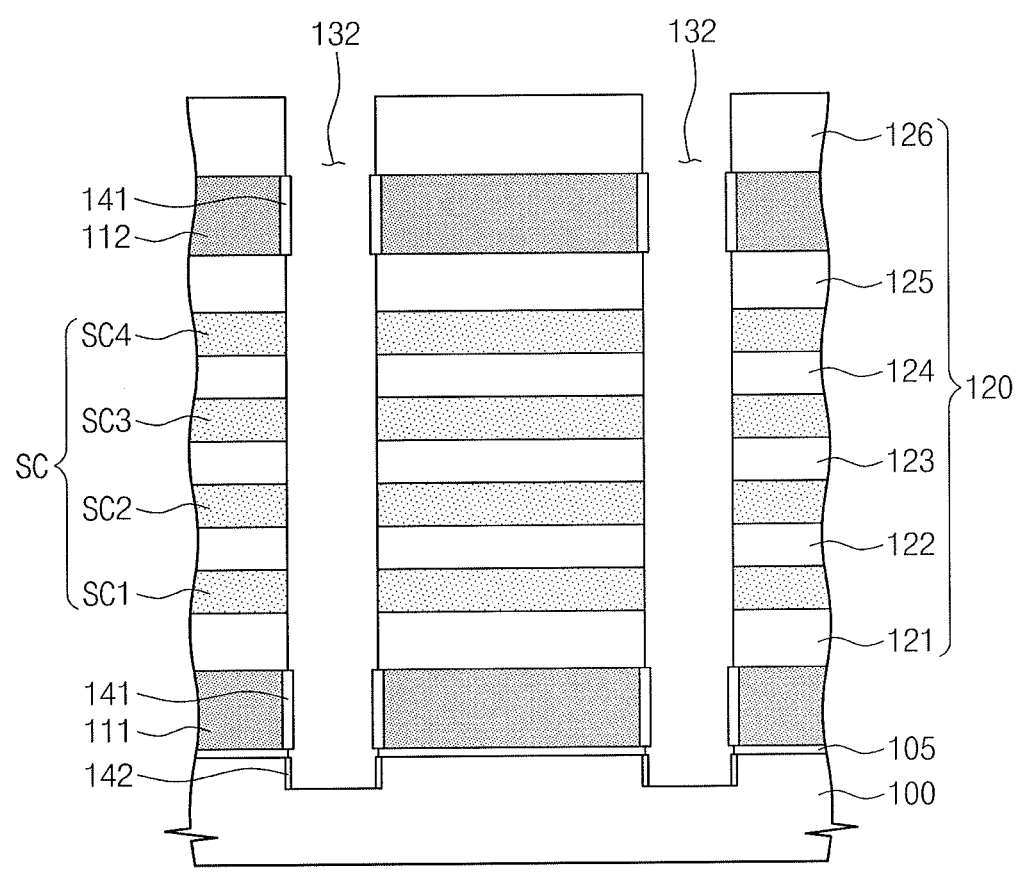

Referring to FIG. 15, a bottom surface of the substrate thermal oxide layer 142 may be removed, e.g., a portion of the substrate thermal oxide layer 142 formed on the bottom surface of the trench formed in the substrate 100 during the forming of the penetration region 132 may be removed. A removal of the substrate thermal oxide layer 142 may be performed by, e.g., a dry etching using plasma having a strong directivity. A sidewall portion, e.g., portions on sidewalls of the trench formed in the substrate 100 during the forming of the penetration region, of the substrate thermal oxide layer 142 may remain.

Figure 16:
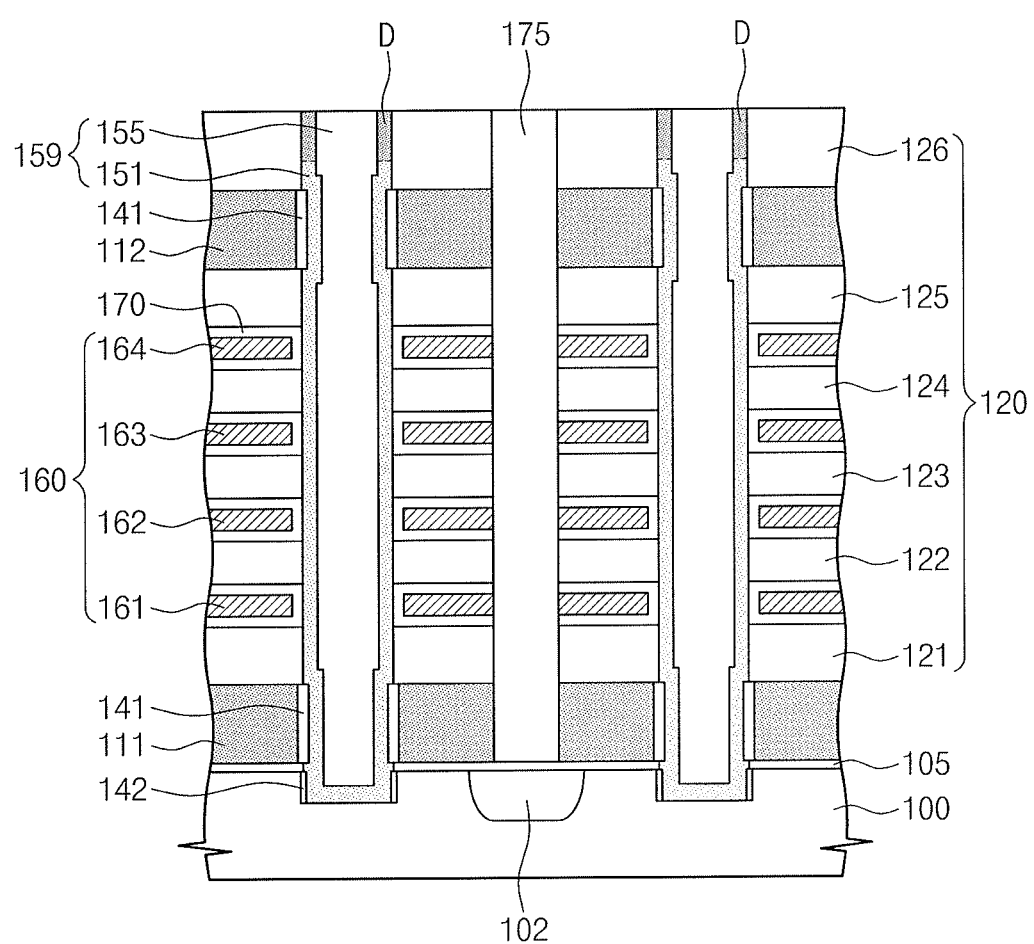

Referring to FIG. 16, a semiconductor device in accordance with a modified embodiment of the first exemplary embodiment is provided. A structure illustrated in FIG. 16 may be obtained by performing the processes described with reference to FIGS. 8 through 12 on the structure illustrated in FIG. 15. Unlike FIG. 12, a sidewall portion of the substrate thermal oxide layer 142 may remain on the substrate 100.

Figure 17:
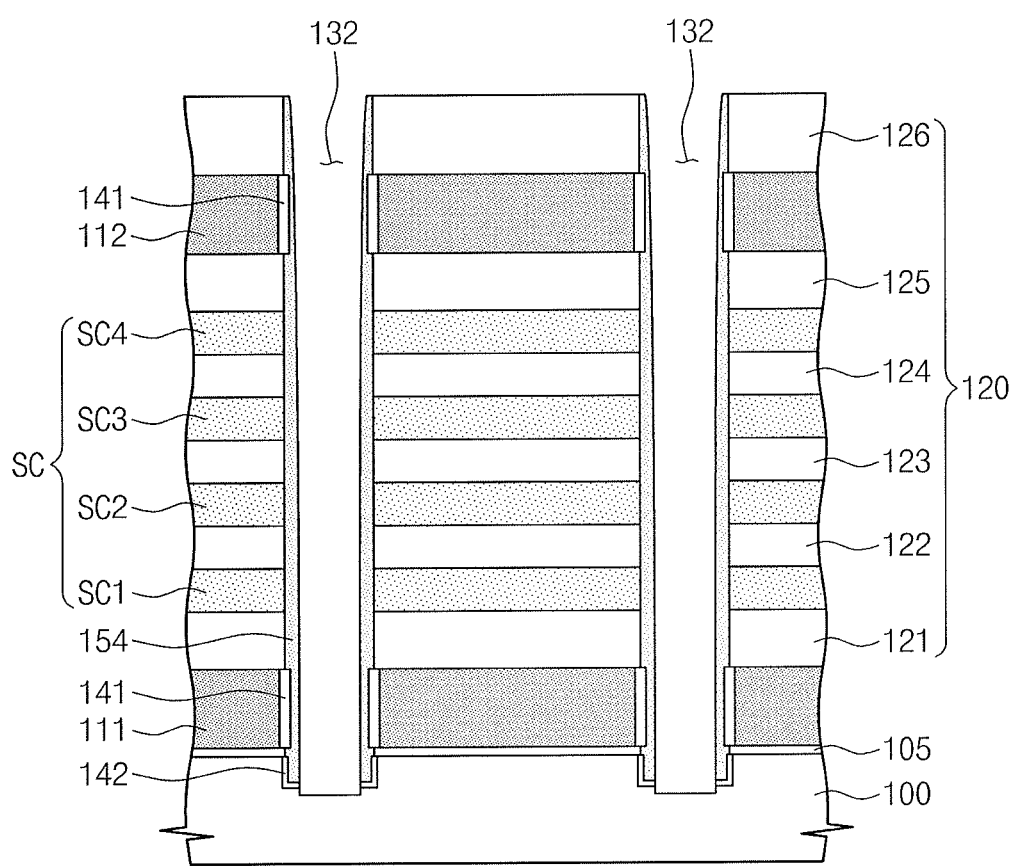
FIGS. 17 through 19 illustrate cross-sectional views of stages in a method of manufacturing the semiconductor device, according to an exemplary embodiment.
Figure 18:
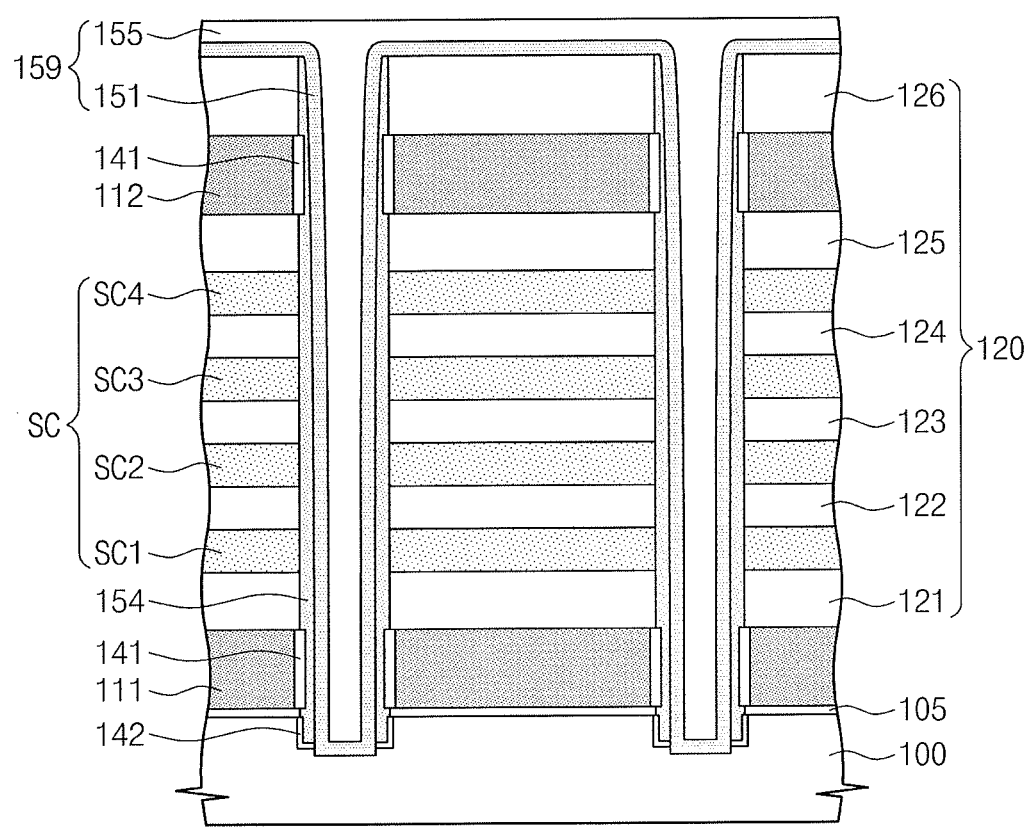
Figure 19:
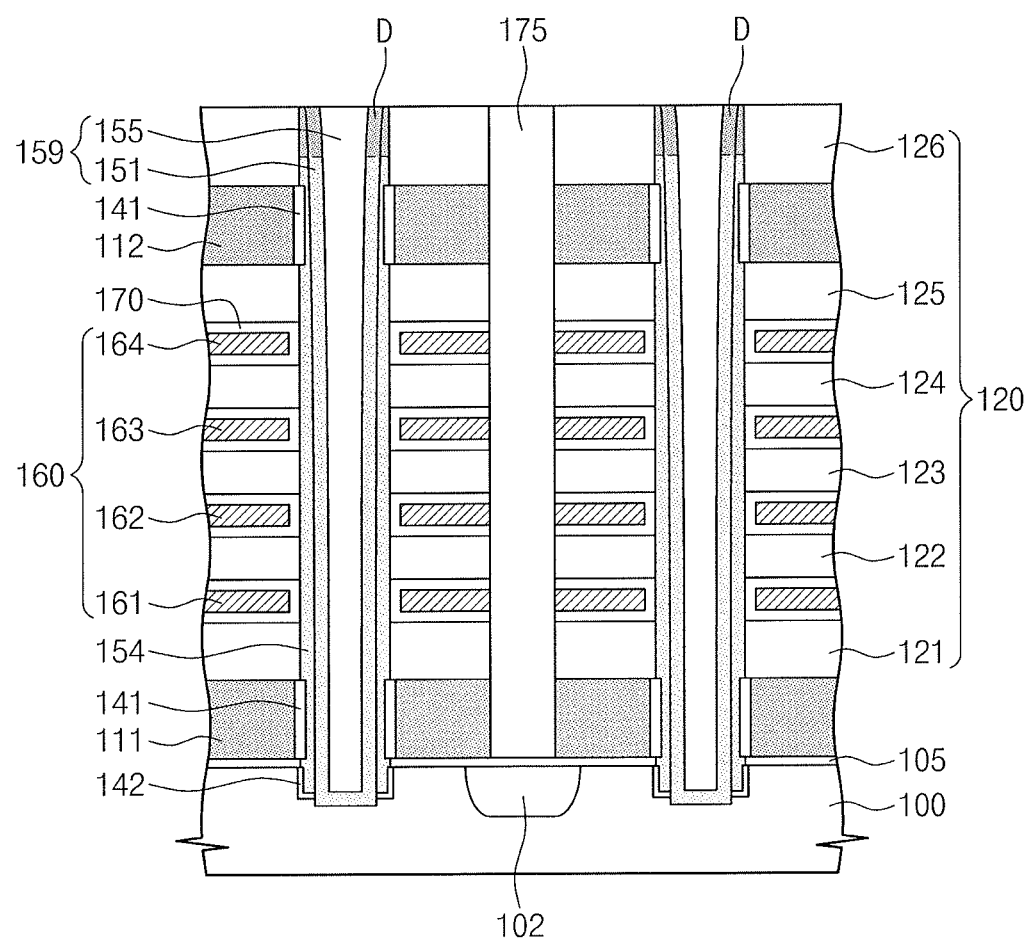

Referring to FIGS. 17, 18 and 19, a method of manufacturing a semiconductor device in accordance with another modified embodiment of the first exemplary embodiment is described. For brevity of description, the description of common features may be omitted below.

FIG. 17 shows a different method from the method illustrated in FIG. 15, e.g., only a portion of the bottom surface of the substrate thermal oxide layer 142 may be removed. According to an exemplary embodiment, a spacer 154 may be formed on a sidewall of the penetration region 132, e.g., after forming the substrate thermal oxide layer 142. The spacer 154 may be formed from, e.g., polysilicon. A portion of the substrate thermal oxide layer 142, e.g., portion of the bottom surface, may be removed using the spacer 154 as an etching mask. When removing the bottom surface of the substrate thermal oxide layer 142, a portion of the substrate 100 may be etched together. The etching process may be, e.g., a dry etching process and/or a wet etching process.

Referring to FIG. 18, a channel pattern 151 may be formed on the spacer 154. A buried layer 155 filling the penetration region 132 may be formed inside the channel pattern 151. According to an exemplary embodiment, the channel pattern 151 may not have an uneven surface because the spacer 154 is formed between the select gate insulating layer 141 and the channel pattern 151.

Referring to FIG. 19, a semiconductor device in accordance with a modified embodiment of the first exemplary embodiment is provided. A structure illustrated in FIG. 19 may be obtained by performing the processes described with reference to FIGS. 10 through 12 on the structure of FIG. 18. A portion of the substrate thermal oxide layer 142 may remain on a bottom surface of the active pattern 159. The spacer 154 and the channel pattern 151 may constitute an active region together. For example, the drain region D may be formed in both the channel pattern 151 and the spacer 154. Alternatively, in the case that the spacer 154 is formed from an insulating layer, it may be removed before the channel pattern 151 is formed.

Figure 20:
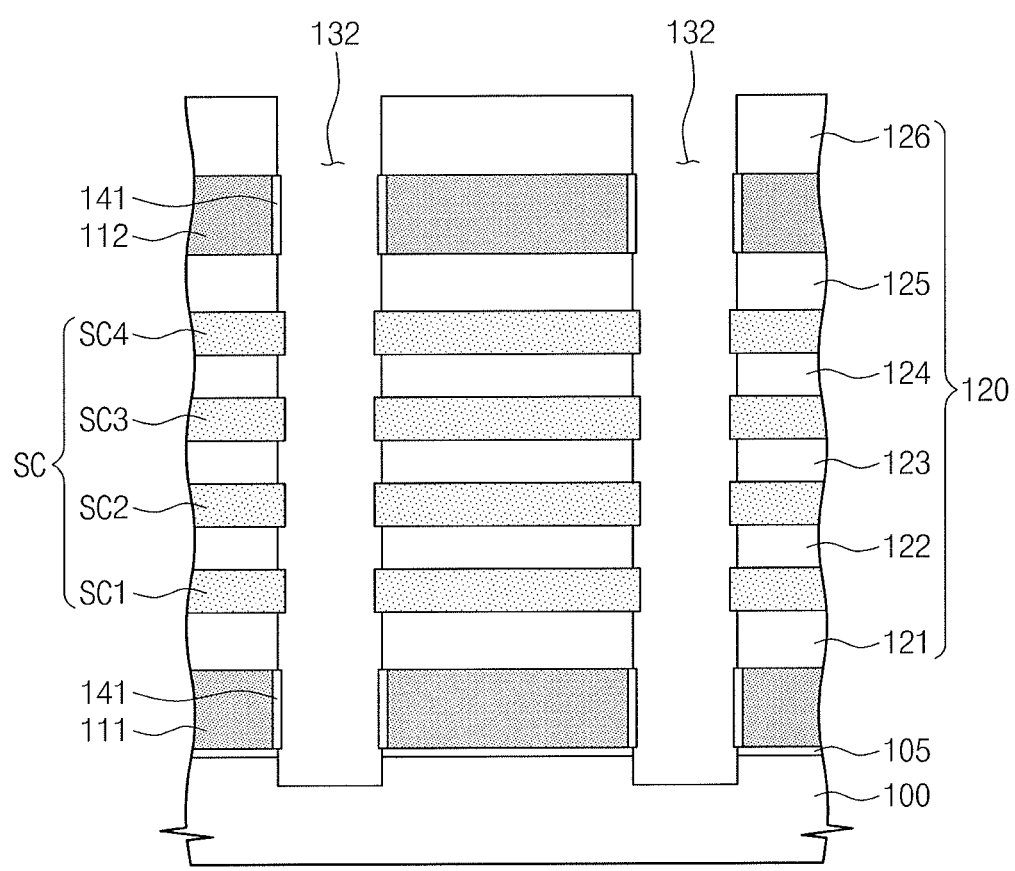
FIGS. 20 and 21 illustrate cross-sectional views of stages in a method of manufacturing the semiconductor device, according to an exemplary embodiment.
Figure 21:
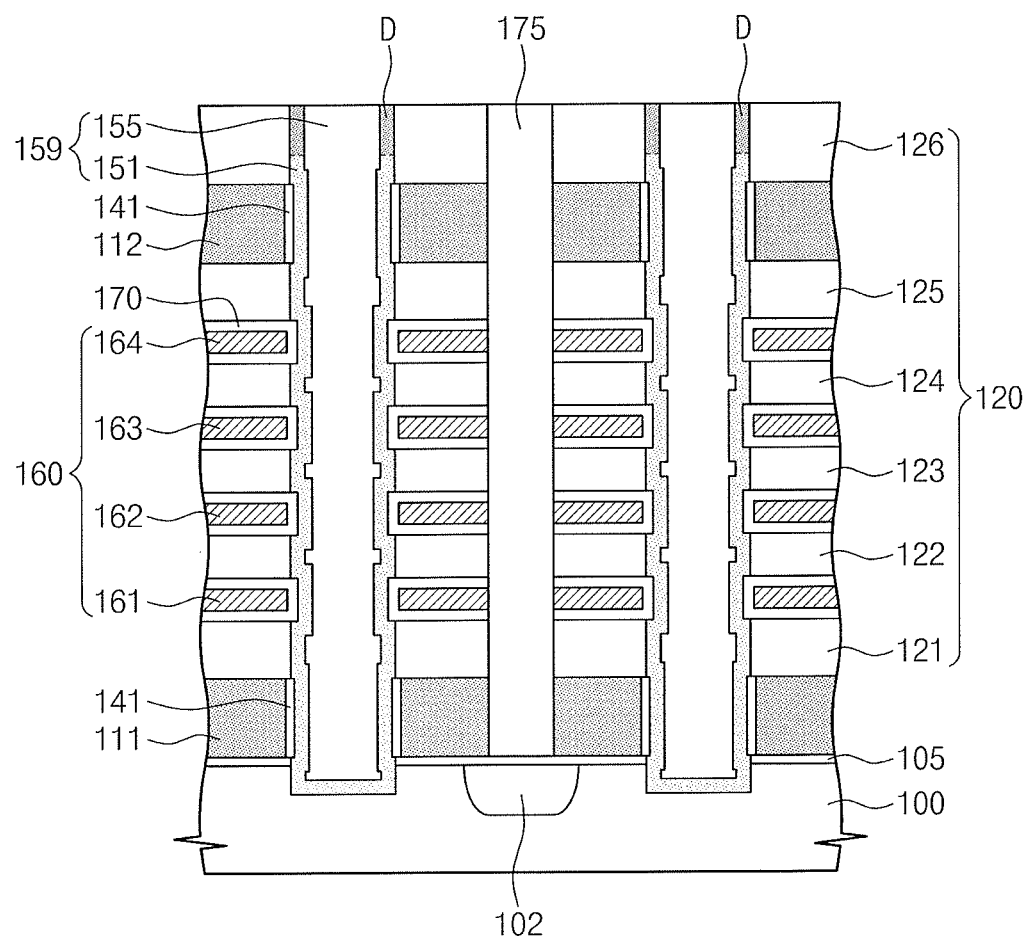

Referring to FIGS. 20 and 21, a method of manufacturing a semiconductor device in accordance with another modified embodiment of the first exemplary embodiment is described. For brevity of description, the description of common features may be omitted below.

FIG. 20 illustrates an exemplary embodiment in which the substrate thermal oxide layer 142 is removed from the structure of FIG. 14. Referring to FIG. 14, the substrate thermal oxide layer 142 may be thinner than the select gate insulating layer 141. In the case that the lower and upper select gate layers 111 and 112 are polysilicon and the substrate 100 is single crystalline silicon, an oxide layer by a thermal oxidation process may be more thickly formed on the lower and upper select gate layers 111 and 112. Thus, when the select gate insulating layer 141 and the substrate thermal oxide layer 142 are etched at the same time, the select gate insulating layer 141 may remain. The select gate insulating layer 141 may be thinner than before the etching process. When an etching process is performed, sidewalls of the insulating layers 120 may also be etched. Sidewalls of the storage layers 170 may remain substantially unetched. As such, the storage layers 170 may protrude further in a direction toward a center of the penetration region 132 than the insulation layers 120. The etching process may be performed using an etching solution having an etching selectivity with respect to an oxide layer. A sidewall of the penetration region 132 may have an uneven sidewall surface due to, e.g., the selective etching process.

Referring to FIG. 21, the structure illustrated in FIG. 21 may be obtained by performing the processes described with reference to FIGS. 8 through 12 on the structure of FIG. 20. For example, the sidewall of the penetration region 132 may include a plurality of protrusions and a plurality of recesses such that the channel pattern 151 has an uneven surface that corresponds to the plurality of protrusions and recesses of the sidewall of the penetration region 132.

Figure 22:
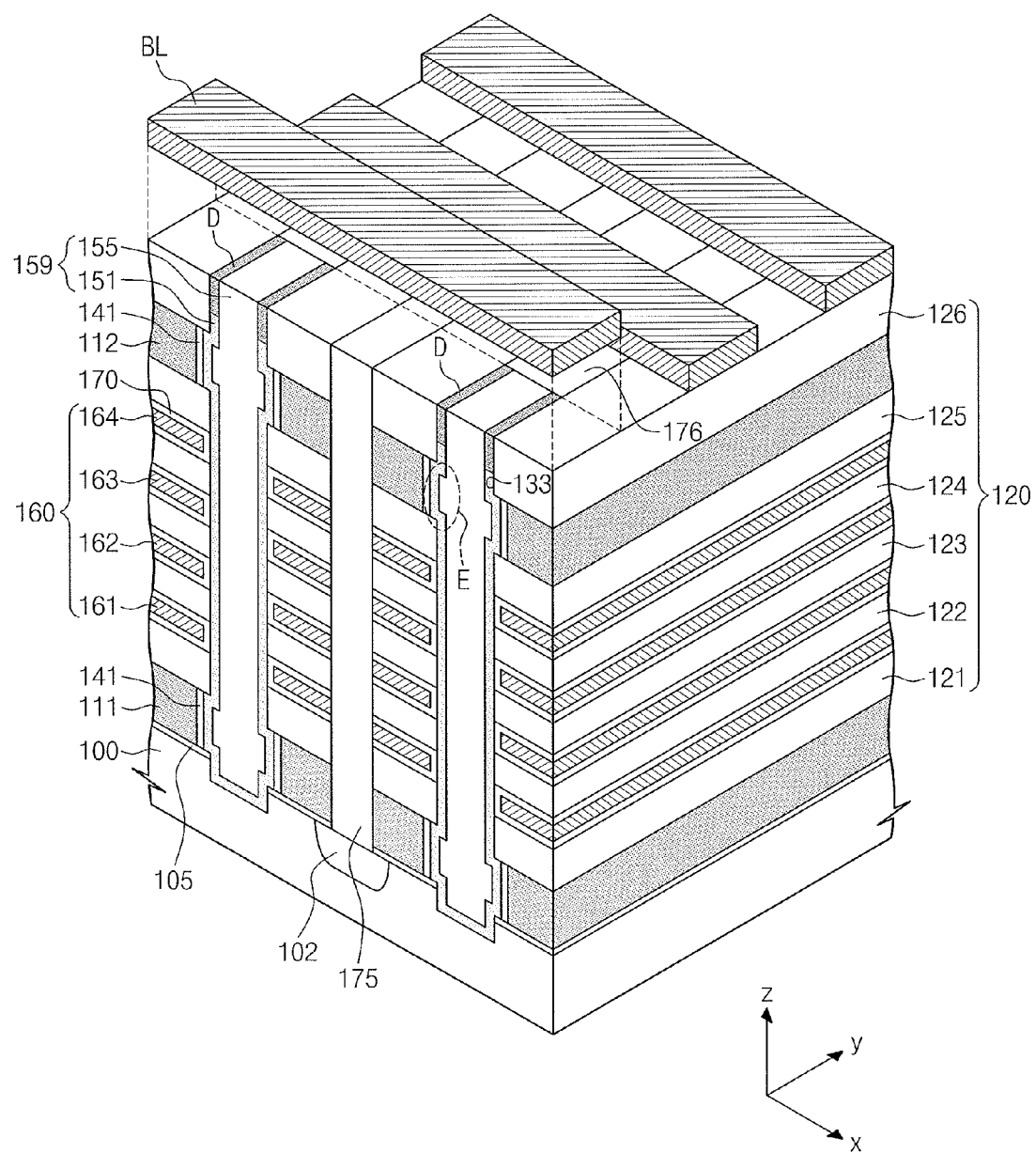
FIG. 22 illustrates a perspective view of a semiconductor device, according to an exemplary embodiment.

Referring to FIG. 22, a semiconductor device in accordance with a second exemplary embodiment is provided. For brevity of description, the description of common features may be omitted below.

An active pattern 159 may further include an extension portion E protruding from a sidewall of the active pattern 159 to the lower and upper select gate layers 111 and 112. In the second exemplary embodiment, a penetration region 133 may have a trench shape extending in a second direction, e.g., in the y-axis direction. The active pattern 159 may include a channel pattern 151 formed along sidewalls of the penetration region 133 and a buried layer 155 filling, e.g., completely filling, the penetration region 133. The active patterns 159 arranged in the second direction may be divided by a buried pillar 176.

Referring to FIGS. 23 through 30, a method of manufacturing a semiconductor device in accordance with the second exemplary embodiment is described.

Figure 23:
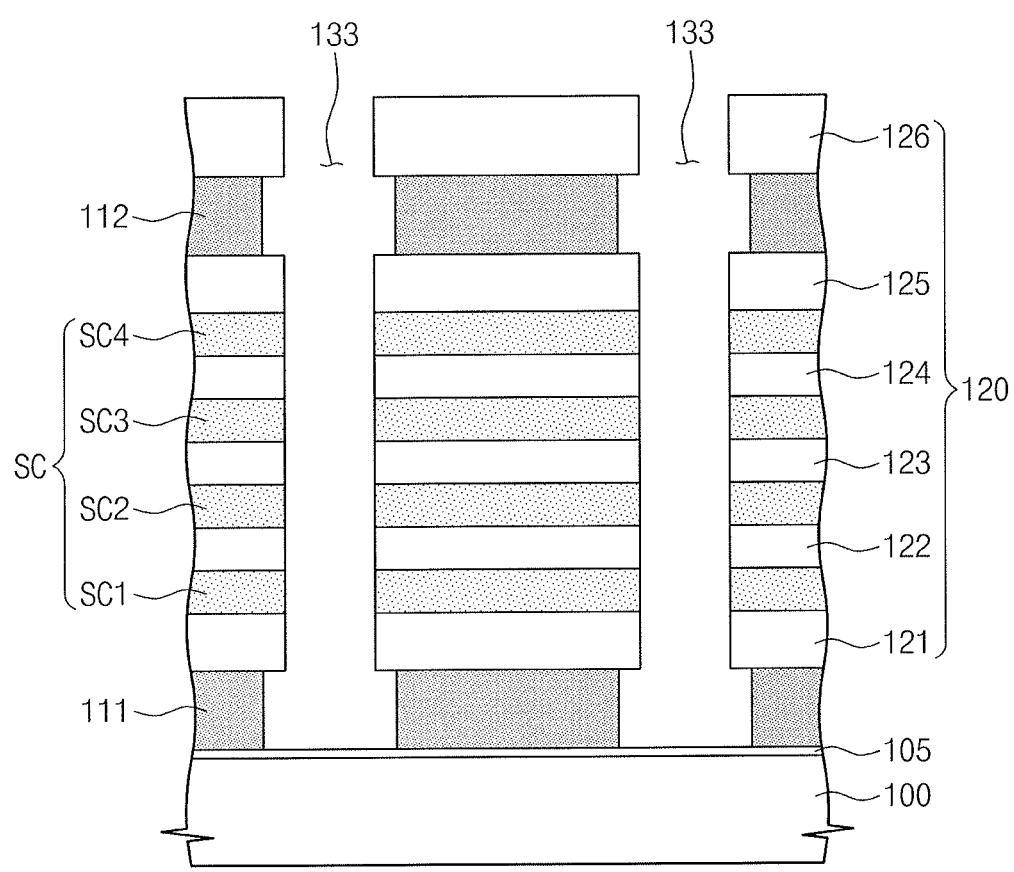
FIGS. 23 through 30 illustrate cross-sectional views of stages in a method of manufacturing the semiconductor device, according to an exemplary embodiment.

Referring to FIG. 23, sidewalls of the lower and upper select gate layers 111 and 112 described in FIG. 4 may be recessed. That is, the sidewalls of the lower and upper select gate layers 111 and 112 exposed by the penetration region 133 may be etched. The etching process may be performed with, e.g., an etching solution including an etching selectivity with respect to silicon.

Figure 24:
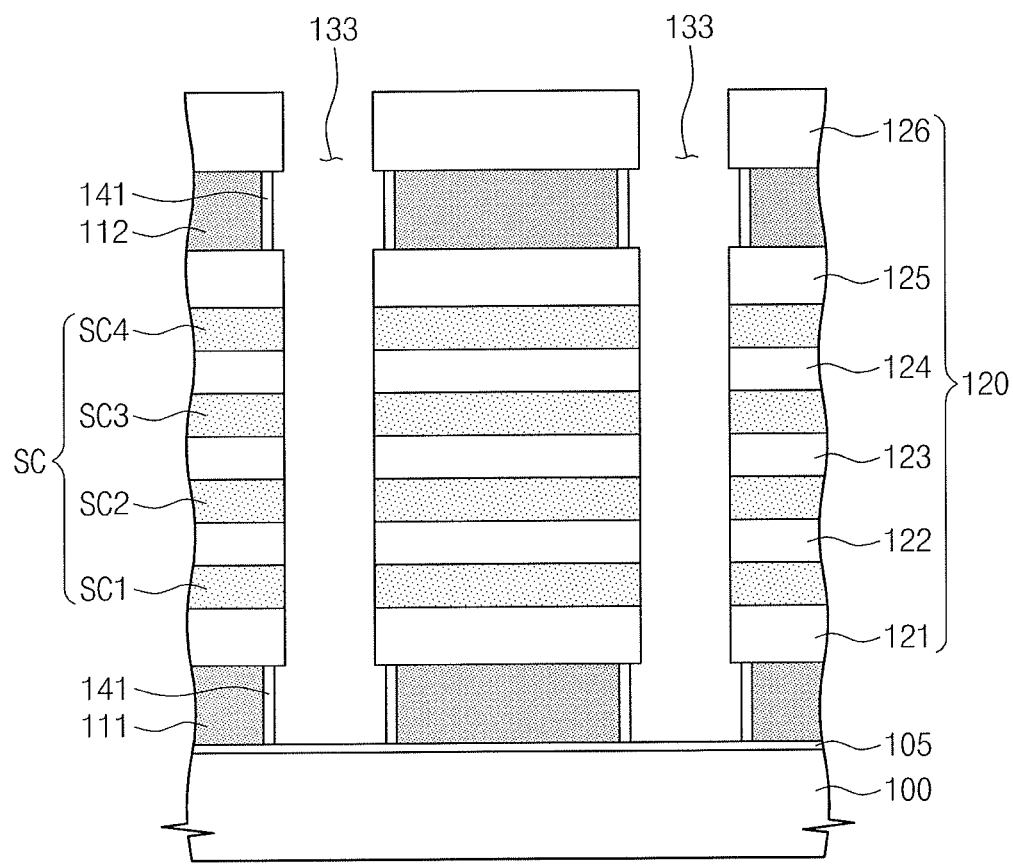

Referring to FIG. 24, a select gate insulating layer 141 may be formed on sidewalls of the lower and upper select gate layers 111 and 112 exposed by the penetration region 133. The select gate insulating layer 141 may be formed by, e.g., a thermal oxidation process.

Figure 25:
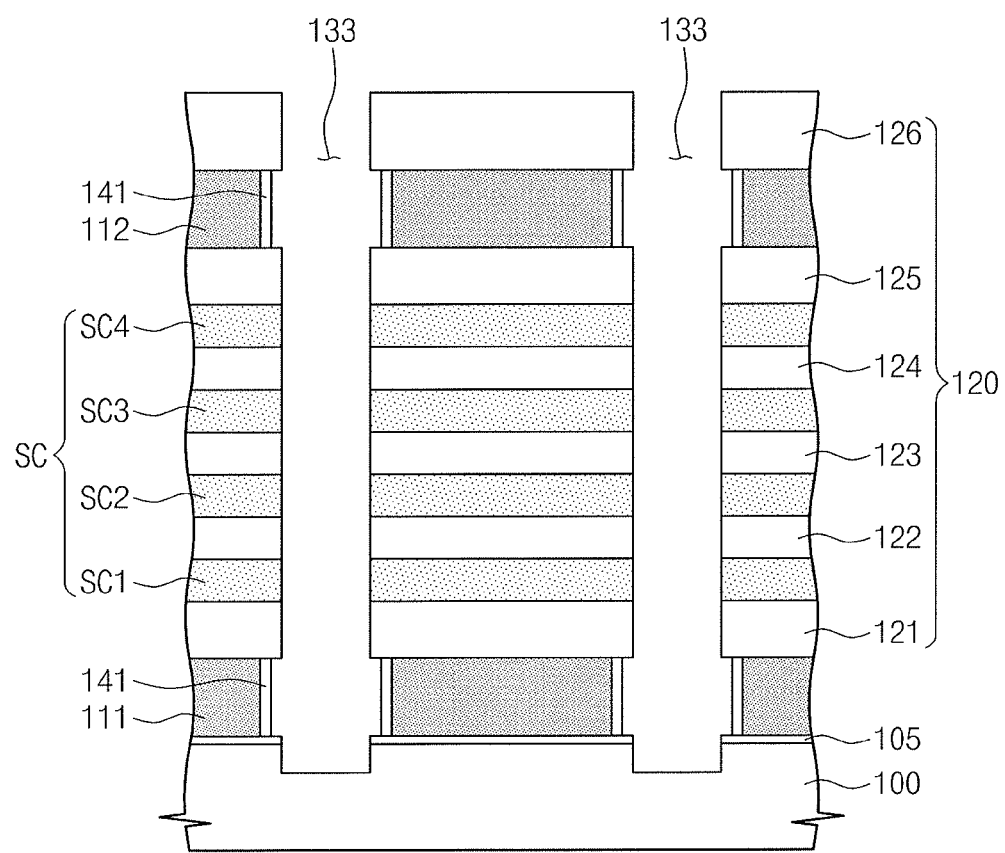

Referring to FIG. 25, the substrate 100 may be exposed by removing the buffer insulating layer 105 exposed by the penetration region 133. When removing the buffer insulating layer 105, a portion of the substrate 100 may be recessed together. As an example, a removal of the buffer insulating layer 105 may be performed by, e.g., a dry etching using plasma having a strong directivity. Alternatively, the buffer insulating layer 105 and a portion of the substrate 100 may be removed while forming the penetration region 133. In this case, the substrate thermal oxide layer 142 may be formed along with the select gate insulating layer 141.

Figure 26:
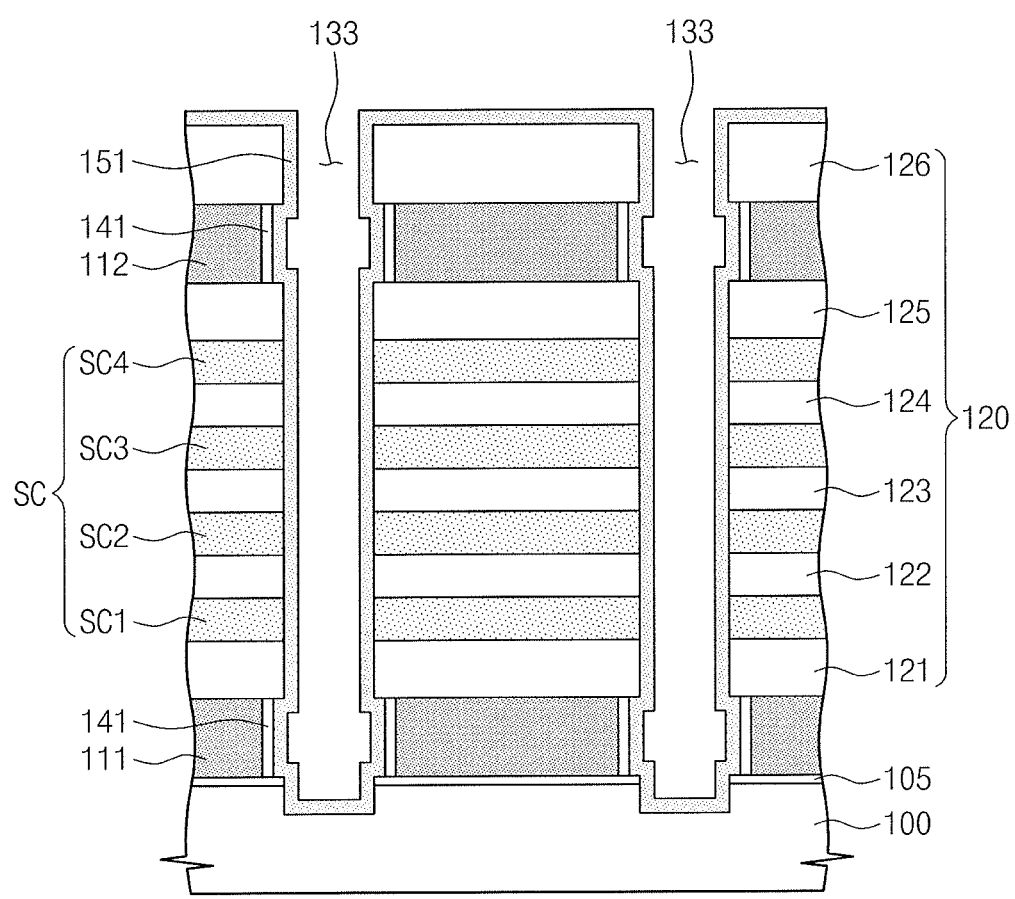

Referring to FIG. 26, a channel pattern 151 may be formed along a sidewall and a lower portion of the penetration region 133. The channel pattern 151 may be formed from, e.g., silicon. A portion of the channel pattern 151 provided on sidewalls of the lower and upper select gate layers 111 and 112 may be more recessed than a portion of the channel pattern 151 provided on sidewalls of the sacrificial layers SC. Therefore, the channel pattern 151 may be an uneven surface due to, e.g., the recessed structure of the lower and upper gate layers 111 and 112 with respect to the sacrificial layers SC and/or the insulating layers 120.

Figure 27:
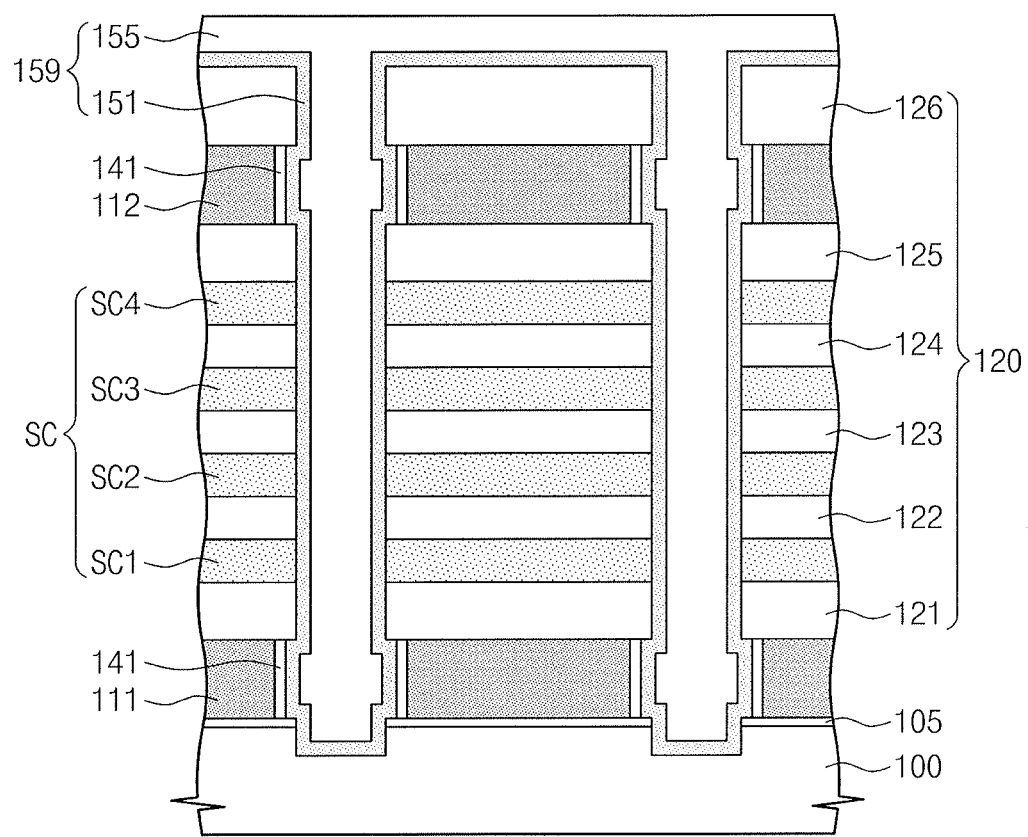

Referring to FIG. 27, a buried layer 155 may be formed on the channel pattern 151 to fill, e.g., completely fill, the penetration region 133. The buried layer 155 may be, e.g., a nitride layer or an oxynitride layer. The channel pattern 151 and the buried layer 155 may constitute an active pattern 159. The channel pattern 151 and the buried layer 155 may be formed using, e.g., a CVD process or an ALD process.

Figure 28:
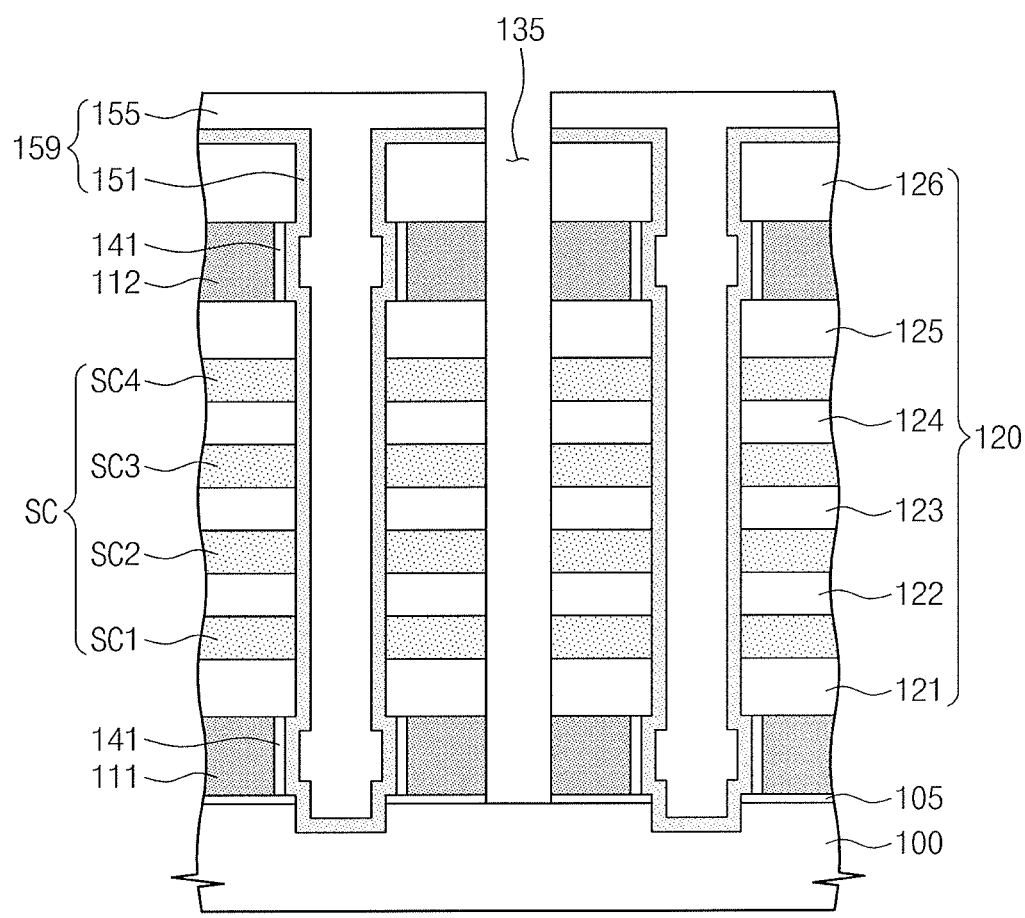

Referring to FIG. 28, the channel pattern 151, the buried layer 155, the lower and upper select gate layers 111 and 112, the insulating layers 120 and the sacrificial layers SC may be successively patterned to form a trench 135. Forming the trench 135 may be performed by, e.g., an anisotropic etching process. The trench 135 may extend in the second direction, e.g., in the y-axis direction. As a result, the lower and upper select gate layers 111 and 112, the insulating layers 120, and the sacrificial layers SC may have a line shape extending in the second direction, e.g., in the y-axis direction. A bottom of the trench 135 may expose the substrate 100. When the trench 135 formed, a portion of the substrate 100 may also be patterned.

Figure 29:
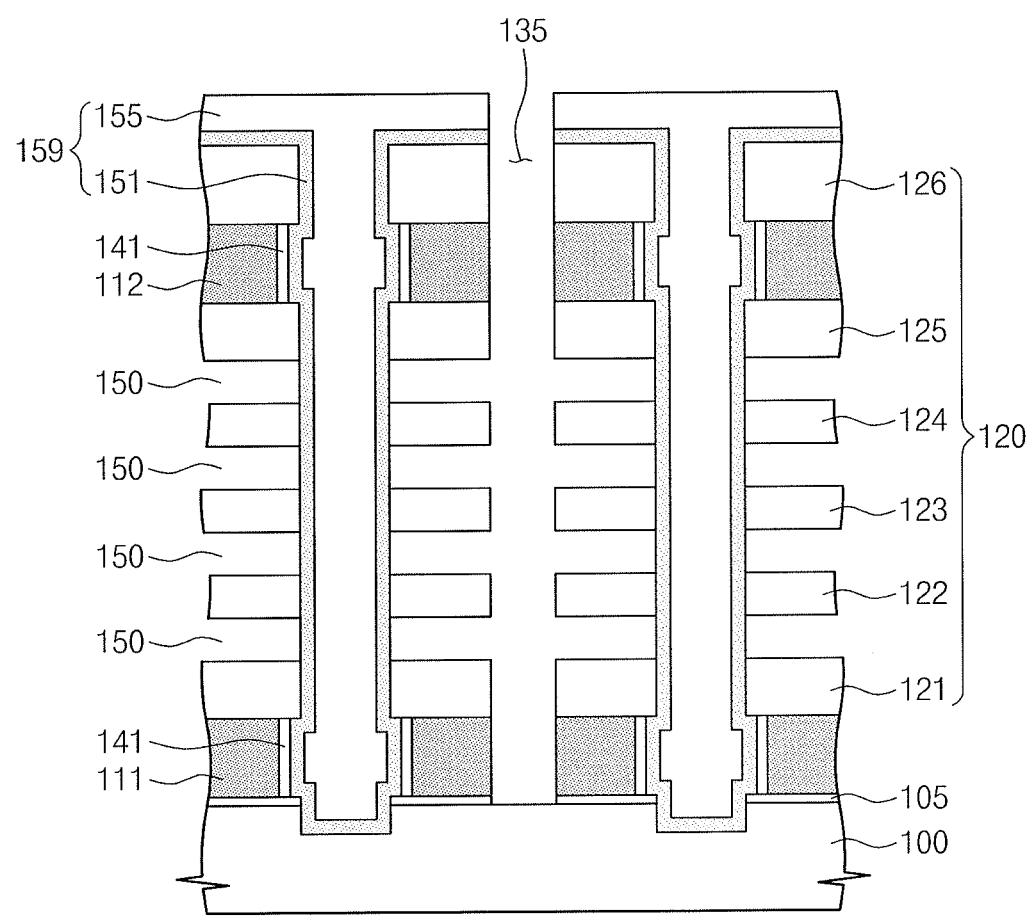

Referring to FIG. 29, the sacrificial layers SC exposed by the trench 135 may be removed by, e.g., a selective etching process to form recess regions 150. The selective etching process may be, e.g., an isotropic etching. The selective etching process may be an isotropic wet etching and/or an isotropic dry etching. An etching rate of the sacrificial layers SC by the selective etching process may be greater than etching rates of the insulating layers 120, the lower and upper select gate layers 111 and 112, and the channel pattern 151. Therefore, after performing the selective etching process, the insulating layers 120, the lower and upper select gate layers 111 and 112, and the channel pattern 151 may remain. The recess regions 150 may expose portions of sidewall of the channel pattern 151 that were previously in contact with the sacrificial layers SC.

Figure 30:
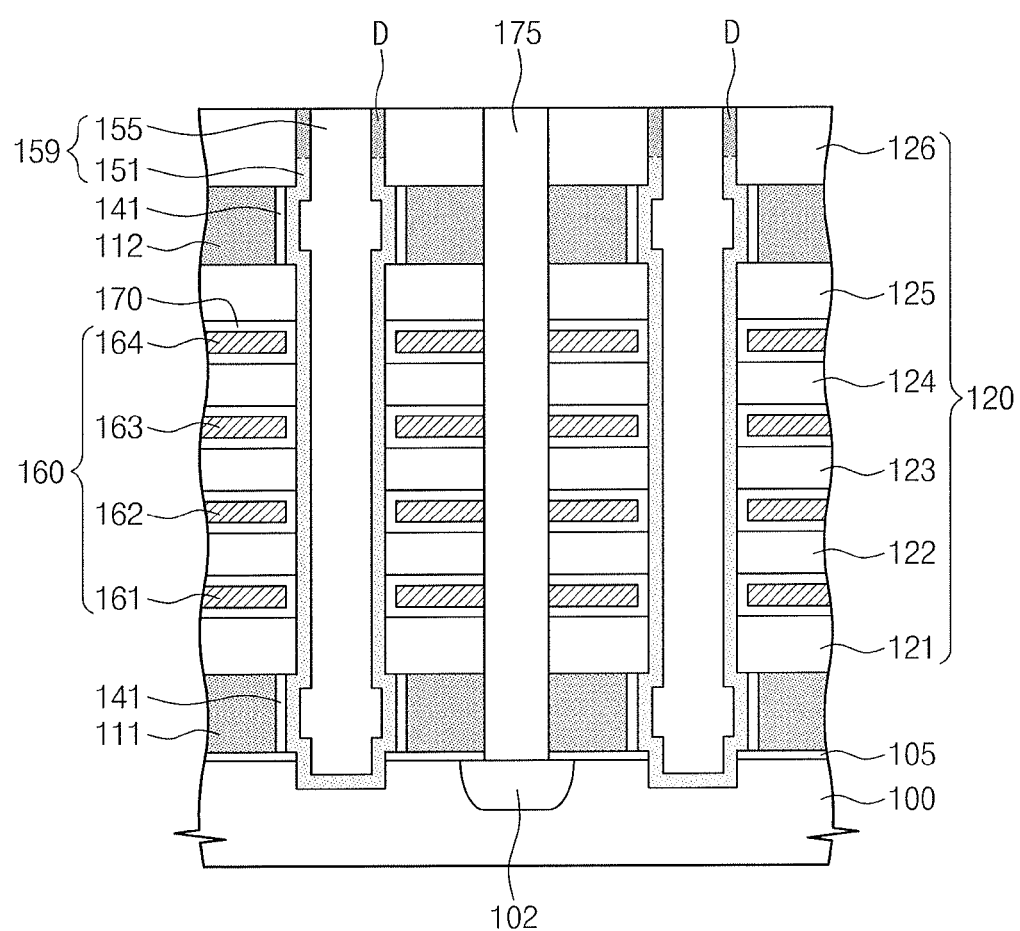

Referring to FIG. 30, after the recess regions 150 are formed, an information storage layer 170 may be formed on the substrate 100. The information storage layer 170 may be formed using a deposition process, e.g., CVD or ALD, which can provide a superior step difference coating characteristic. Cell gate layers 160 (161~164) filling the recess regions 150 may be formed. After forming the information storage layer 170, a gate conductive layer (not shown) may be formed on the substrate 100. After forming the gate conductive layer, portions of the gate conductive layer disposed outside the recess regions 150 may be removed to form cell gate layers 160 in the recess regions 150. The cell gate layers 160 disposed on different layers vertically from a top surface of the substrate 100 may be separated, e.g., spaced apart, from one another by the etching process.

A common source region 102 may be formed in, e.g., within, the substrate 100 under the trench 135. The common source region 102 may have a line shape extending in the second direction, e.g., in the y-axis direction. The common source region 102 may be a region doped with a second type dopant. The substrate 100 may be doped with a first type dopant. The common source region 102 may be formed by implanting the second type dopant ions into the substrate 100. At this time, the uppermost insulating layer 126 may be used as an ion implantation mask.

A drain region D may be formed at an upper portion of the channel pattern 151. The drain region D may be doped with the second type dopant. A bottom surface of the drain region D may be higher than a top surface of the upper select gate layer 112. Alternatively, a bottom surface of the drain region D may have at a height similar to, e.g., substantially the same as, a top surface of the upper select gate layer 112. The drain region D may be formed in concurrence with, e.g., at the same times as, the common source region 102. Alternatively, the drain region D may be formed before or after forming the common source region 102, i.e., the drain region D may be formed separately from the forming of the common source region 102.

An electrode separation pattern 175 may be formed to fill, e.g., completely fill and/or substantially completely fill, the trench 135. Forming the electrode separation pattern 175 may include, e.g., firstly forming an electrode separation pattern filling the trench 135 and secondly performing a planarization process down to a top surface of the uppermost insulating layer 126, e.g., to expose the uppermost insulating layer 126. The electrode separation pattern 175 may include an insulating material. For instance, the electrode separation pattern 175 may be formed from a high density plasma oxide layer, a spin on glass (SOG) layer, and/or a CVD oxide layer.

The second exemplary embodiment may be modified, e.g., like the modified embodiments of the first exemplary embodiment described with reference to FIGS. 13 through 21.

Figure 31:
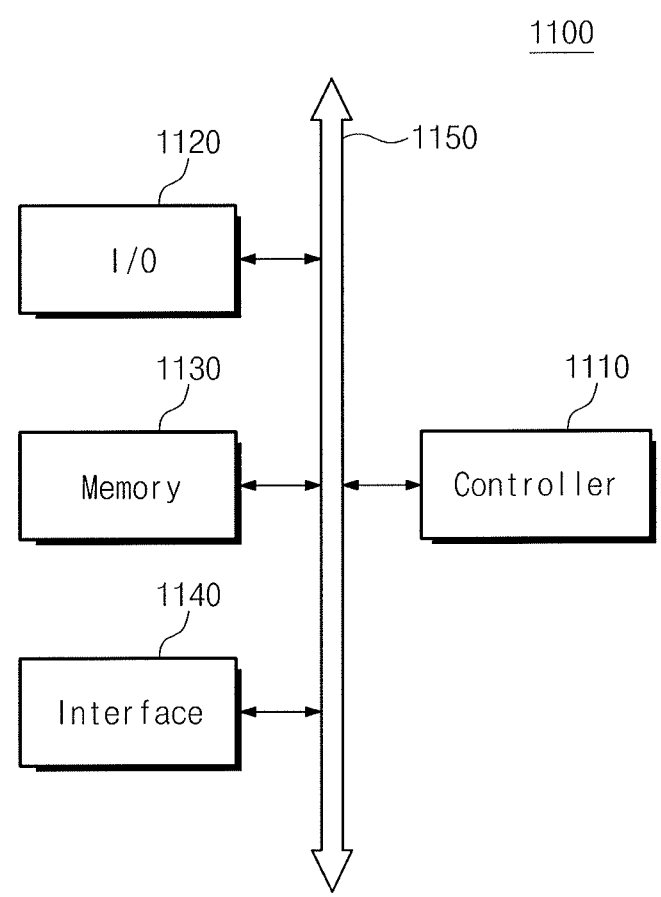
FIG. 31 illustrates a block diagram of a memory system including a semiconductor device, according to an exemplary embodiment.

FIG. 31 illustrates a block diagram of an exemplary memory system including a semiconductor device formed according to exemplary embodiments.

Referring to FIG. 31, a memory system 1100 may be applied to, e.g., a portable computer, a web tablet, a wireless phone, a mobile phone, a digital music player, a memory card, and/or all devices that can transmit and/or receive data in a wireless environment.

The memory system 1100 may include a controller 1110, an input/output device 1120 such as a keypad, a keyboard and a displayer, a memory 1130, an interface 1140, and a bus 1150. The memory 1130 and the interface 1140 may communicate with each other through the bus 1150.

The controller 1110 may include at least one microprocessor, at least one digital signal processor, at least one micro controller or other process devices similar to the microprocessor, the digital signal processor, and the micro controller. The memory 1130 may be used to store an instruction executed by the controller 1110. The input/output device 1120 can receive data or a signal from the outside of the memory system 1100 or transmit data or a signal to the outside of the memory system 1100. For example, the input/output device 1120 may include a keyboard, a keypad and/or a displayer.

The memory 1130 may include a nonvolatile memory device, according to exemplary embodiments. The memory 1130 may further include a different kind of memory, e.g., a volatile memory device capable of random access and various kinds of memories.

The interface 1140 may perform a function of transmitting data to a telecommunication network or receiving data from a telecommunication network.

Figure 32:
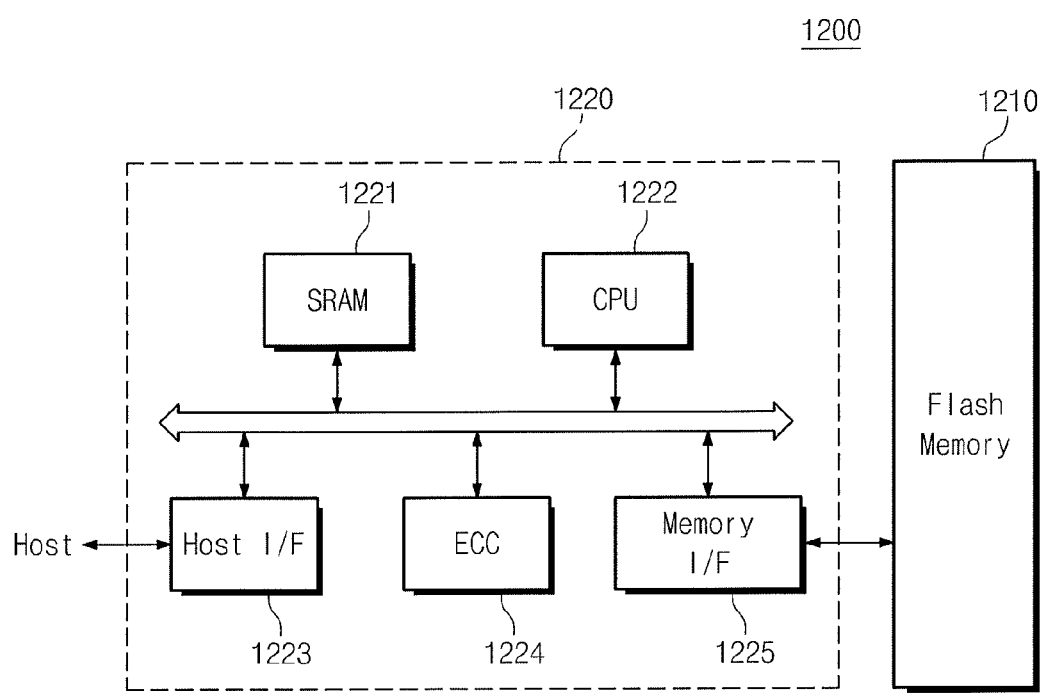
FIG. 32 illustrates a block diagram of a memory card including a semiconductor device, according to an exemplary embodiment.

FIG. 32 illustrates a block diagram of an exemplary memory card including a semiconductor device formed according to exemplary embodiments.

Referring to FIG. 32, the memory card 1200 may support a storage capability of a large capacity and may be fitted with a flash memory device 1210 according to exemplary embodiments. The memory card 1200, in accordance with an exemplary embodiment, may include a memory controller 1220 controlling all the data exchanges between a host and the flash memory device 1210.

A SRAM 1221 may be used as an operation memory of a central processing unit (CPU) 1222. A host interface 1223 may include data exchange protocols of a host connected to the memory card 1200. An error correction block (ECC) 1224 may detect and correct errors included in data readout from a multi bit flash memory device 1210. A memory interface 1225 may interface with the flash memory device 1210. A processing unit 1222 may perform all the control operations for a data exchange of the memory controller 1220. Although not illustrated in the drawing, it is apparent to one of ordinary skill in the art, that the memory card 1200 may further include a ROM (not shown) capable of storing code data for interfacing with the host.

Figure 33:
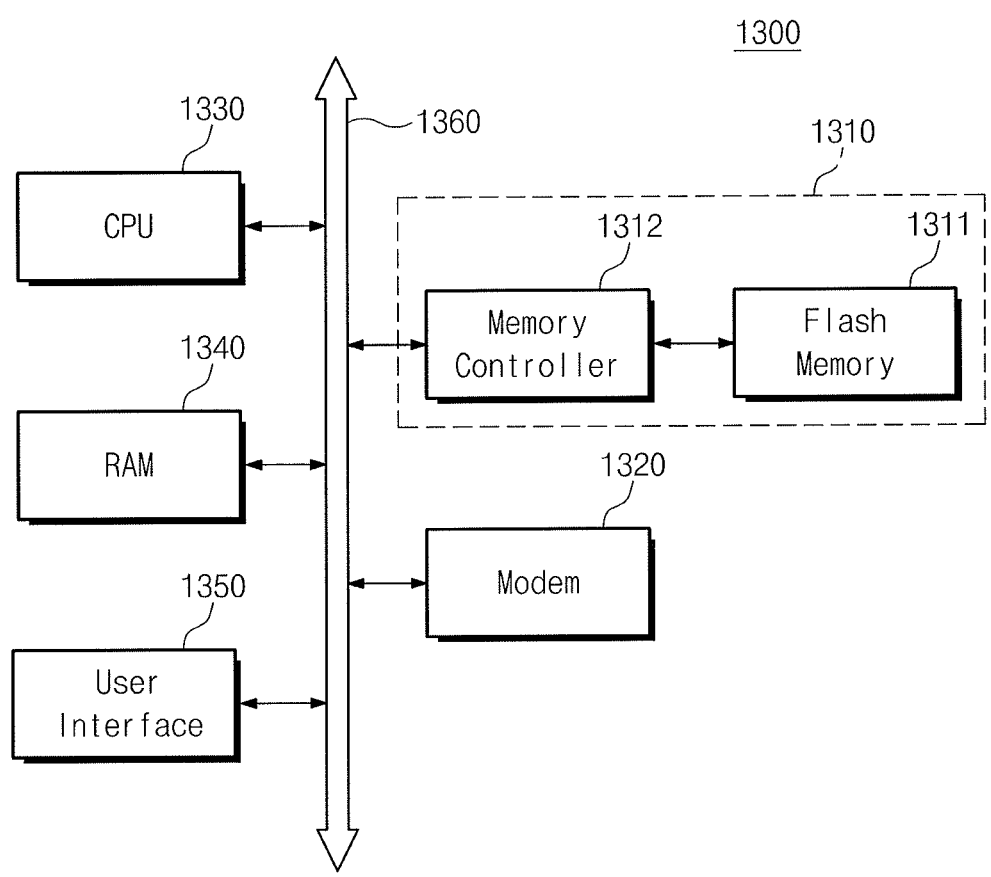
FIG. 33 illustrates a block diagram of an information processing system including a semiconductor device, according to an exemplary embodiment.

FIG. 33 illustrates a block diagram of an exemplary information processing system that includes a semiconductor device formed according to exemplary embodiments.

Referring to FIG. 33, a flash memory system 1310 may be built in a data processing system such as a mobile product or a desktop computer. A data processing system 1300 may include the flash memory system 1310, a modem 1320, a central processing unit (CPU) 1330, a random access memory (RAM) 1340, a user interface 1350 that are each electrically connected to a system bus 1360. The flash memory system 1310 may be constituted to be the same with the memory system or the flash memory system described above. The flash memory system 1310 may store data processed by the central processing unit 1330 or data received from an external device. The flash memory system 1310 may be constituted by a solid state disk (SSD) and in this case, the data processing system 1310 may stably store huge amounts of data in the flash memory system 1310. As reliability increases, the flash memory system 1310 may reduce resources used to correct errors, thereby providing a high speed data exchange function to the data processing system 1300. Although not illustrated in FIG. 33, it is apparent to one of ordinary skill in the art that the data processing system 1300 may further include an application chipset, a camera image processor (CIS) and/or an input/output device.

The flash memory device or the memory system may be mounted with various types of packages. For example, the flash memory device or the memory system may be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), and mounting packages.

An insulating layer of a select gate and an information storage layer of a cell gate may be formed to have a different structure from each other. Accordingly, the possibility of and/or it can be prevented that a threshold voltage of a select transistor becomes unstable due to a hot carrier. The select gate and the cell gates may be formed to have different materials from each other, e.g., the select gate may be formed of a first material that is different from a second material that forms the cell gates. For example, the select gate may be formed of polysilicon and the cell gates may be formed of formed of a material that includes at least one selected from metal, metal silicide, conductive metal nitride, and doped semiconductor material. Also, a gate length of the select gate may be more easily controlled compared with the case that the select gate and the cell gate are formed at the same time.

By way of summation and review, as the electronics industry has developed, the requirement for an integration of a semiconductor memory device has increased. The integration of the semiconductor memory device may function as a main factor in determining the price of products. That is, as the integration of semiconductor memory device increases, the price of products may be reduced. Thus, a requirement for the improvement of the integration of the semiconductor memory device is growing.

The integration of the semiconductor memory device may be determined by, e.g., an area that unit memory cells occupy because integration may be affected by a level of a fine pattern formation technology. However, a miniaturization of patterns is gradually reaching a limit due to, e.g., the very high price of equipment and/or a difficulty in the semiconductor manufacturing process.

To overcome those limits, three-dimensional semiconductor memory devices have been being suggested. According to embodiments, the memory cells may be three dimensionally arranged in the semiconductor memory devices. However, to produce a three-dimensional semiconductor memory device in large quantities, a process technology is required that can realize a reliable product characteristic while a manufacturing cost per bit is less than that of a two-dimensional semiconductor memory device. Accordingly, embodiments, e.g., the exemplary embodiments discussed above, relate to three-dimensional semiconductor devices and a method of forming the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims. Therefore, the above-disclosed subject matter is to be considered illustrative, and not restrictive.

What is claimed is:

1. A semiconductor memory device, comprising:
a substrate;
an active pattern disposed substantially vertically on the substrate;
a first select gate layer and a second select gate layer on the substrate;
a plurality of cell gate layers stacked with insulating layers therebetween, the plurality of cell gate layers disposed between the first select gate layer and the second select gate layer;
a select gate insulating layer disposed between the first select gate layer and the active pattern; and
a tunnel insulating layer disposed between the cell gate layers and the active pattern,
wherein the first and second select gate layers and the cell gate layers include conductive materials, and
wherein the select gate insulating layer is thicker than the tunnel insulating layer, in a first direction parallel to a top surface of the substrate, and wherein the first select gate layer is thicker than at least one of the plurality of cell gate layers, in a second direction vertical to the top surface of the substrate.

2. The semiconductor memory device of claim 1, wherein the active pattern includes a channel pattern and a buried layer.

3. The semiconductor memory device of claim 1, wherein each of the cell gate layers includes metal, metal silicide, conductive metal nitride, or a doped semiconductor material.

4. The semiconductor memory device of claim 1, wherein the first select gate layer includes polysilicon.

5. The semiconductor memory device of claim 1, further comprising a buffer insulating layer disposed between the first select gate layer and the substrate.

6. The semiconductor memory device of claim 1, further comprising a charge storage layer and a blocking layer respectively disposed between each of the cell gate layers and the tunnel insulating layer.

7. The semiconductor memory device of claim 1, further comprising a common source region and a drain region, wherein the common source region is disposed adjacent to the first select gate layer and the drain region is disposed adjacent to the second select gate layer.

8. The semiconductor memory device of claim 7, further comprising a bitline electrically connected to the drain region.

9. The semiconductor memory device of claim 1, further comprising insulating layers disposed between the first select gate layer and one of the cell gate layers adjacent to the first select gate layer and between adjacent ones of the cell gate layers.

10. A semiconductor memory device, comprising:
a substrate;
an active pattern disposed substantially vertically on the substrate;
a first select gate layer and a second select gate layer on the substrate;
a plurality of cell gate layers stacked with insulating layers therebetween, the plurality of cell gate layers disposed between the first select gate layer and the second select gate layer;
a select gate insulating layer disposed between the first select gate layer and the active pattern; and
a tunnel insulating layer disposed between the cell gate layers and the active pattern,
wherein the first and second select gate layers and the cell gate layers include conductive materials, and
wherein a sidewall of the first select gate layer is recessed with respect to a sidewall of the cell gate layers in a first direction that is parallel to a top surface of the substrate, and
wherein the first select gate layer is thicker than at least one of the plurality of cell gate layers, in a second direction perpendicular to a top surface of the substrate.

11. The semiconductor memory device of claim 10, wherein the select gate insulating layer is thicker than the tunnel insulating layer, in the first direction.

12. The semiconductor memory device of claim 10, wherein the first select gate layer includes polysilicon and the select gate insulating layer includes a thermal oxide layer.

13. The semiconductor memory device of claim 10, further comprising insulating layers disposed between the first select gate layer and one of the cell gate layers adjacent to the first select gate layer and between adjacent ones of the cell gate layers.

14. The semiconductor memory device of claim 13, further comprising a charge storage layer and a blocking layer respectively disposed between each of the cell gate layers and the tunnel insulating layer.

15. The semiconductor memory device of claim 14, wherein the blocking layer horizontally extends from a region between each of the cell gate layers and the tunnel insulating layer to cover a top surface and a bottom surface of each of the cell gate layers.

16. A semiconductor memory device, comprising:
a substrate;
a channel pattern disposed substantially vertically on the substrate;
a first select gate layer and a second select gate layer on the substrate;
a stacked structure including a plurality of cell gate layers and a plurality of insulating layers alternately and vertically stacked, the stacked structure disposed between the first select gate layer and the second select gate layer;
a select gate insulating layer disposed between the first select gate layer and the channel pattern; and
a tunnel insulating layer disposed between the cell gate layers and the channel pattern,
wherein the first and second select gate layers and the cell gate layers include conductive materials, and
wherein a gap between opposing sides of the channel pattern corresponding to the cell gate layers is less than a gap between opposing sides of the channel pattern corresponding to the first select gate layer, and
wherein the first select gate layer is thicker than at least one of the plurality of cell gate layers, in a first direction vertical to a top surface of the substrate.

17. The semiconductor memory device of claim 16, wherein the select gate insulating layer is thicker than the tunnel insulating layer, in a second direction parallel to a top surface of the substrate.

18. The semiconductor memory device of claim 16, wherein the first select gate layer includes polysilicon and the select gate insulating layer includes a thermal oxide layer.

19. The semiconductor memory device of claim 16, further comprising a charge storage layer and a blocking layer respectively disposed between each of the cell gate layers and the tunnel insulating layer,
   wherein the blocking layer horizontally extends from a region between each of the cell gate layers and the tunnel insulating layer to cover a top surface and a bottom surface of each of the cell gate layers.

20. The semiconductor memory device of claim 16, further comprising insulating layers disposed between the first select gate layer and one of the cell gate layers adjacent to the first select gate layer and between adjacent ones of the cell gate layers.

21. The semiconductor memory device of claim 1, wherein the active pattern includes an extension portion protruding from a sidewall of the active pattern to the first select gate layer.

22. The semiconductor memory device of claim 21, wherein the active pattern has a first thickness on a portion adjacent to the insulating layers and a second thickness on the extension portion adjacent to the first select gate layer, and the first thickness is substantially the same as the second thickness.

\* \* \* \* \*